United States Patent
Mallik et al.

(10) Patent No.: US 10,484,135 B2
(45) Date of Patent: Nov. 19, 2019

(54) MITIGATION OF BURSTY INTERFERENCE

(71) Applicant: QUALCOMM Incorporated, San Diego, CA (US)

(72) Inventors: Siddhartha Mallik, San Diego, CA (US); Tao Luo, San Diego, CA (US); Jing Jiang, San Diego, CA (US); Tingfang Ji, San Diego, CA (US); Krishna Kiran Mukkavilli, San Diego, CA (US); Naga Bhushan, San Diego, CA (US); Joseph Binamira Soriaga, San Diego, CA (US); Kambiz Azarian Yazdi, San Diego, CA (US); Peter Gaal, San Diego, CA (US); John Edward Smee, San Diego, CA (US); Chih Ping Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 321 days.

(21) Appl. No.: 14/968,376

(22) Filed: Dec. 14, 2015

(65) Prior Publication Data

US 2016/0173232 A1    Jun. 16, 2016

Related U.S. Application Data

(60) Provisional application No. 62/092,035, filed on Dec. 15, 2014, provisional application No. 62/133,383, filed on Mar. 15, 2015.

(51) Int. Cl.
*H04L 1/00* (2006.01)
*H03M 13/29* (2006.01)
*H04L 1/18* (2006.01)

(52) U.S. Cl.
CPC ...... *H04L 1/0061* (2013.01); *H03M 13/2909* (2013.01); *H03M 13/2966* (2013.01);
(Continued)

(58) Field of Classification Search
CPC ... H04L 1/0061; H04L 1/0009; H04L 1/0041; H04L 1/0045; H04L 1/0066; H04L 1/1819; H03M 13/2909; H03M 13/2966
See application file for complete search history.

(56) References Cited

U.S. PATENT DOCUMENTS 8,151,160 B1 * 4/2012 Andreev ............ H03M 13/1117
714/752
8,379,738 B2   2/2013 Pi et al.
(Continued)

OTHER PUBLICATIONS

Huitema C, "The case for Packet Level FEC," IFIP TC6 Fifth International Workshop on Protocols for High Speed Networks, Sophia Antipolis, France, Oct. 1996, Oct. 1, 1996 (Oct. 1, 1996), XP055183600, Retrieved from the Internet: URL:http://citeseerx.ist.psu.edu/viewdoc/download?doi=10.1.1.52.166&rep=rep1&type=pdf [retrieved on Apr. 16, 2015].

(Continued)

*Primary Examiner* — Kyle Vallecillo
(74) *Attorney, Agent, or Firm* — Norton Rose Fulbright US LLP

(57) ABSTRACT

Coding for bursty interference is discussed in which a base station receives data bits for transmission. The base station may generate code blocks including information bits and parity bits. The base station may also generate parity check code blocks including information bits corresponding to information bits of the generated code blocks. The base station may transmit the code blocks and the parity check code blocks to a mobile device to improve decoding. When errors are detected, the mobile device may decode the received code blocks using hard or soft parity checks and the parity check code blocks.

24 Claims, 16 Drawing Sheets

(52) U.S. Cl.
CPC .......... *H04L 1/0009* (2013.01); *H04L 1/0025* (2013.01); *H04L 1/0041* (2013.01); *H04L 1/0045* (2013.01); *H04L 1/0066* (2013.01); *H04L 1/1819* (2013.01); *H04L 1/1822* (2013.01); *H04L 1/1854* (2013.01)

(56) References Cited

U.S. PATENT DOCUMENTS

| | | | |
|---|---|---|---|
| 8,504,900 B2* | 8/2013 | Gunnam | H03M 13/1142 714/780 |
| 8,873,467 B2 | 10/2014 | Dinan | |
| 2003/0002502 A1 | 1/2003 | Gibson et al. | |
| 2003/0192003 A1* | 10/2003 | Das | H03M 13/09 714/758 |
| 2004/0187072 A1* | 9/2004 | Trott | H03M 13/2906 714/801 |
| 2004/0228320 A1* | 11/2004 | Laroia | H04L 1/0057 370/349 |
| 2006/0190271 A1 | 8/2006 | Kim et al. | |
| 2008/0155385 A1* | 6/2008 | Jeong | H03M 13/116 714/801 |
| 2008/0165806 A1* | 7/2008 | Reznik | H04W 72/005 370/485 |
| 2008/0244360 A1* | 10/2008 | Mokhlesi | G06F 11/1068 714/758 |
| 2010/0023834 A1* | 1/2010 | Richardson | H03M 13/116 714/751 |
| 2011/0194511 A1 | 8/2011 | Chen et al. | |
| 2013/0227373 A1 | 8/2013 | Shen et al. | |
| 2013/0336430 A1* | 12/2013 | Au Yeung | H04L 25/03171 375/340 |
| 2014/0032988 A1 | 1/2014 | Murakami et al. | |
| 2015/0067435 A1 | 3/2015 | Yerramalli et al. | |
| 2015/0098440 A1 | 4/2015 | Yang et al. | |
| 2015/0331748 A1* | 11/2015 | Cohen | G06F 11/1076 714/764 |

OTHER PUBLICATIONS

International Search Report and Written Opinion—PCT/US2015/065856—ISA/EPO—dated Mar. 31, 2016.

Zhao Y., et al., "Joint Network and Channel Decoding for HARQ in Wireless Broadcasting System," Vehicular Technology Conference Fall (VTC 2010-FALL), 2010 IEEE 72nd, IEEE, Piscataway, NJ, USA, Sep. 6, 2010 (Sep. 6, 2010), pp. 1-5, XP031770349, ISBN: 978-14244-3573-9.

* cited by examiner

MITIGATION OF BURSTY INTERFERENCE

CROSS REFERENCE TO RELATED APPLICATIONS

This application claims the benefit of U.S. Patent Application No. 62/092,035 entitled, "CODING FOR BURSTY INTERFERENCE," filed on Dec. 15, 2014, and co-pending U.S. Patent Application No. 62/133,383, entitled "CODE BLOCK LEVEL ERROR CORRECTION TO MITIGATE BURSTY PUNCTURING AND INTERFERENCE IN A MULTI-LAYER PROTOCOL WIRELESS SYSTEM," filed on Mar. 15, 2015, both of which are hereby incorporated by reference.

BACKGROUND

Field

Aspects of the present disclosure relate generally to wireless communication systems, and more particularly, to data encoding and decoding to reduce the impact of bursty interference in wireless communication systems.

Background

Wireless communication networks are widely deployed to provide various communication services such as voice, video, packet data, messaging, broadcast, and the like. These wireless networks may be multiple-access networks capable of supporting multiple users by sharing the available network resources. Such networks, which are usually multiple access networks, support communications for multiple users by sharing the available network resources. One example of such a network is the Universal Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). Examples of multiple-access network formats include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations or node Bs that can support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Of particular significance is bursty interference, in which the interference is caused by an interfering signal that has a period that is only a small fraction of the period of the transmission with which it interferes. A typical transmission often includes a plurality of blocks of information. However, because of overhead constraints, many transmissions are either accepted or retransmitted as a whole. Individual blocks of a transmission are not independently transmitted. Therefore, even when the interference is bursty such that the interference causes a loss of information in only a small percentage of the blocks of the transmission, the entire transmission, including the blocks for which no information was lost, must be retransmitted. The process is inefficient and unnecessarily consumes excess resources. Research and development continue to advance the UMTS technologies not only to meet the growing demand for mobile broadband access, but to advance and enhance the user experience with mobile communications.

SUMMARY

In one aspect of the disclosure, a method of wireless communication includes receiving, by a base station, a plurality of data bits, generating, by the base station, one or more code blocks, each of the one or more code blocks including one or more information bits and one or more parity bits, wherein for each code block the one or more information bits are generated based, at least in part, on data bits in the received plurality of data bits, and wherein for each code block the one or more parity bits are generated based, at least in part, on the one or more information bits of the code block, generating, by the base station, one or more parity check code blocks, each of the one or more parity check code blocks including one or more information bits, wherein for each parity check code block the one or more information bits correspond to information bits of the one or more code blocks, and transmitting, by the base station, each of the one or more code blocks and the one or more parity check code blocks to a mobile device.

In an additional aspect of the disclosure, an apparatus configured for wireless communication includes means for receiving, by a base station, a plurality of data bits, means for generating, by the base station, one or more code blocks, each of the one or more code blocks including one or more information bits and one or more parity bits, wherein for each code block the one or more information bits are generated based, at least in part, on data bits in the received plurality of data bits, and wherein for each code block the one or more parity bits are generated based, at least in part, on the one or more information bits of the code block, means for generating, by the base station, one or more parity check code blocks, each of the one or more parity check code blocks including one or more information bits, wherein for each parity check code block the one or more information bits correspond to information bits of the one or more code blocks, and means for transmitting, by the base station, each of the one or more code blocks and the one or more parity check code blocks to a mobile device.

In an additional aspect of the disclosure, a computer program product has a computer-readable medium having program code recorded thereon. This program code includes code for causing a computer to receive, by a base station, a plurality of data bits, generate, by the base station, one or more code blocks, each of the one or more code blocks including one or more information bits and one or more parity bits, wherein for each code block the one or more information bits are generated based, at least in part, on data bits in the received plurality of data bits, and wherein for each code block the one or more parity bits are generated based, at least in part, on the one or more information bits of the code block, generate, by the base station, one or more parity check code blocks, each of the one or more parity check code blocks including one or more information bits, wherein for each parity check code block the one or more information bits correspond to information bits of the one or more code blocks, and transmit, by the base station, each of the one or more code blocks and the one or more parity check code blocks to a mobile device.

In an additional aspect of the disclosure, an apparatus includes at least one processor and a memory coupled to the processor. The processor is configured to receive, by a base station, a plurality of data bits, generate, by the base station, one or more code blocks, each of the one or more code blocks including one or more information bits and one or more parity bits, wherein for each code block the one or more information bits are generated based, at least in part, on data bits in the received plurality of data bits, and wherein for each code block the one or more parity bits are generated based, at least in part, on the one or more information bits of the code block, generate, by the base station, one or more parity check code blocks, each of the one or more parity check code blocks including one or more information bits, wherein for each parity check code block the one or more information bits correspond to information bits of the one or more code blocks, and transmit, by the base station, each of the one or more code blocks and the one or more parity check code blocks to a mobile device.

In an additional aspect of the disclosure, a method of wireless communication includes receiving, by a mobile device, one or more code blocks and one or more parity check code blocks, decoding, by the mobile device, the one or more code blocks, determining, by the mobile device, a number of decoded code blocks that have errors, decoding, by the mobile device, the one or more parity check code blocks when one or more of the received code blocks have errors, determining, by the mobile device, a number of decoded parity check code blocks that do not have errors, and correcting, by the mobile device, errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors.

In an additional aspect of the disclosure, an apparatus configured for wireless communication includes means for receiving, by a mobile device, one or more code blocks and one or more parity check code blocks, means for decoding, by the mobile device, the one or more code blocks, means for determining, by the mobile device, a number of decoded code blocks that have errors, means for decoding, by the mobile device, the one or more parity check code blocks when one or more of the received code blocks have errors, means for determining, by the mobile device, a number of decoded parity check code blocks that do not have errors, means for correcting, by the mobile device, errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors.

In an additional aspect of the disclosure, a computer program product has a computer-readable medium having program code recorded thereon. This program code includes code for causing a computer to receive, by a mobile device, one or more code blocks and one or more parity check code blocks, decode, by the mobile device, the one or more code blocks, determine, by the mobile device, a number of decoded code blocks that have errors, decode, by the mobile device, the one or more parity check code blocks when one or more of the received code blocks have errors, determine, by the mobile device, a number of decoded parity check code blocks that do not have errors, and correct, by the mobile device, errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors.

In an additional aspect of the disclosure, an apparatus includes at least one processor and a memory coupled to the processor. The processor is configured to receive, by a mobile device, one or more code blocks and one or more parity check code blocks, decode, by the mobile device, the one or more code blocks, determine, by the mobile device, a number of decoded code blocks that have errors, decode, by the mobile device, the one or more parity check code blocks when one or more of the received code blocks have errors, determine, by the mobile device, a number of decoded parity check code blocks that do not have errors, and correct, by the mobile device, errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors.

In an additional aspect of the disclosure, a method of wireless communication includes receiving, by a mobile device, one or more code blocks and one or more parity check code blocks, decoding, by the mobile device, each of the one or more code blocks, wherein, for each code block, decoding includes generating a logarithm of the likelihood ratio (LLR) value for each bit in the code block based, at least in part, on information bits in the code block, determining, by the mobile device, which code blocks of the one or more code blocks have errors and which code blocks of the one or more code blocks do not have errors, and subsequently decoding, by the mobile device, each of the code blocks determined to have errors, wherein, for each code block subsequently decoded, subsequent decoding includes modifying the LLR value for each bit in the code block based, at least in part, on the previously generated LLR value for information bits in the code block and an LLR value of an information bit in at least one of the received one or more parity check code blocks.

In an additional aspect of the disclosure, an apparatus configured for wireless communication includes means for receiving, by a mobile device, one or more code blocks and one or more parity check code blocks, means for decoding, by the mobile device, each of the one or more code blocks, wherein, for each code block, decoding includes generating a LLR value for each bit in the code block based, at least in part, on information bits in the code block, means for determining, by the mobile device, which code blocks of the one or more code blocks have errors and which code blocks of the one or more code blocks do not have errors, and means for subsequently decoding, by the mobile device, each of the code blocks determined to have errors, wherein, for each code block subsequently decoded, subsequent decoding includes modifying the LLR value for each bit in the code block based, at least in part, on the previously generated LLR value for information bits in the code block and an LLR value of an information bit in at least one of the received one or more parity check code blocks.

In an additional aspect of the disclosure, a computer program product has a computer-readable medium having program code recorded thereon. This program code includes code for causing a computer to receive, by a mobile device, one or more code blocks and one or more parity check code blocks, decode, by the mobile device, each of the one or more code blocks, wherein, for each code block, decoding includes generating a LLR value for each bit in the code block based, at least in part, on information bits in the code block, determine, by the mobile device, which code blocks of the one or more code blocks have errors and which code blocks of the one or more code blocks do not have errors, and subsequently decode, by the mobile device, each of the code blocks determined to have errors, wherein, for each code block subsequently decoded, subsequent decoding includes modifying the LLR value for each bit in the code block based, at least in part, on the previously generated LLR value for information bits in the code block and an LLR value of an information bit in at least one of the received one or more parity check code blocks.

In an additional aspect of the disclosure, an apparatus includes at least one processor and a memory coupled to the processor. The processor is configured to receive, by a mobile device, one or more code blocks and one or more parity check code blocks, decode, by the mobile device, each of the one or more code blocks, wherein, for each code block, decoding includes generating a LLR value for each bit in the code block based, at least in part, on information bits in the code block, determine, by the mobile device, which code blocks of the one or more code blocks have errors and which code blocks of the one or more code blocks do not have errors, and subsequently decode, by the mobile device, each of the code blocks determined to have errors, wherein, for each code block subsequently decoded, subsequent decoding includes modifying the LLR value for each bit in the code block based, at least in part, on the previously generated LLR value for information bits in the code block and an LLR value of an information bit in at least one of the received one or more parity check code blocks.

In one aspect of the disclosure, a method of wireless communication includes receiving, by a mobile device, one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks, and decoding, by the mobile device, the one or more code blocks.

In an additional aspect of the disclosure, an apparatus configured for wireless communication includes means for receiving one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks, and means for decoding the one or more code blocks.

In an additional aspect of the disclosure, a computer program product has a computer-readable medium having program code recorded thereon. This program code includes code for causing a computer to receive one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks, and to decode the one or more code blocks.

In an additional aspect of the disclosure, an apparatus includes at least one processor and a memory coupled to the processor. The processor is configured to receive one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks, and decode the one or more code blocks.

The foregoing has outlined rather broadly the features and technical advantages of the present application in order that the detailed description that follows may be better understood. Additional features and advantages will be described hereinafter which form the subject of the claims. It should be appreciated by those skilled in the art that the conception and specific aspect disclosed may be readily utilized as a basis for modifying or designing other structures for carrying out the same purposes of the present application. It should also be realized by those skilled in the art that such equivalent constructions do not depart from the spirit and scope of the present application and the appended claims. The novel features which are believed to be characteristic of aspects, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present claims.

DETAILED DESCRIPTION

Figure 1:
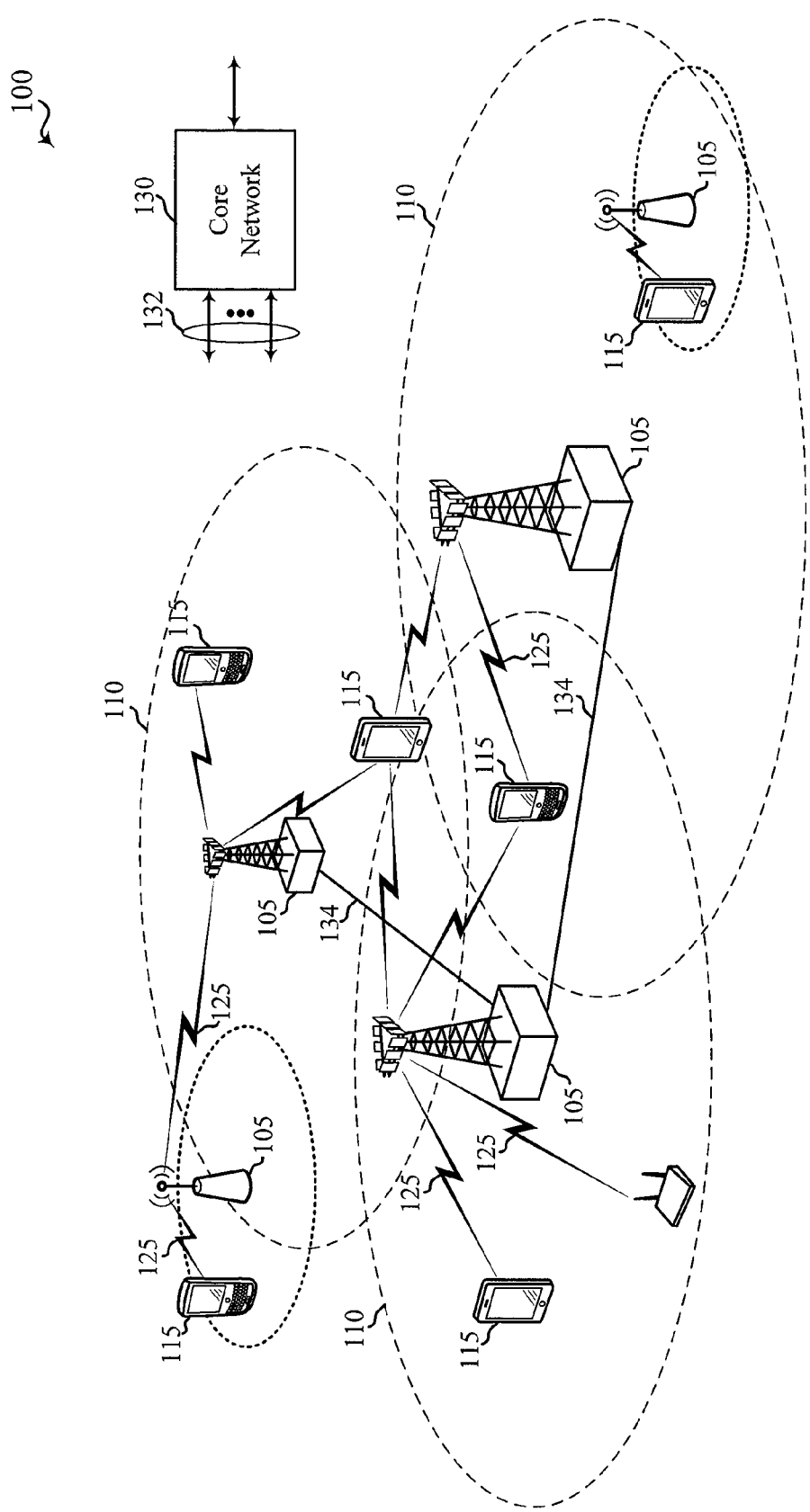
FIG. 1 shows a diagram that illustrates an example of a wireless communications system according to various aspects of the disclosure.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

Operators have so far looked at WiFi as the primary mechanism to use unlicensed spectrum to relieve ever increasing levels of congestion in cellular networks. However, a new carrier type (NCT) based on LTE/LTE-A including an unlicensed spectrum may be compatible with carrier-grade WiFi, making LTE/LTE-A with unlicensed spectrum an alternative to WiFi. LTE/LTE-A with unlicensed spectrum may leverage LTE concepts and may introduce some modifications to physical layer (PHY) and media access control (MAC) aspects of the network or network devices to provide efficient operation in the unlicensed spectrum and to meet regulatory requirements. The unlicensed spectrum may range from 600 Megahertz (MHz) to 6 Gigahertz (GHz), for example. In some scenarios, LTE/LTE-A with unlicensed spectrum may perform significantly better than WiFi. For example, an all LTE/LTE-A with unlicensed spectrum deployment (for single or multiple operators) compared to an all WiFi deployment, or when there are dense small cell deployments, LTE/LTE-A with unlicensed spectrum may perform significantly better than WiFi. LTE/LTE-A with unlicensed spectrum may perform better than WiFi in other scenarios such as when LTE/LTE-A with unlicensed spectrum is mixed with WiFi (for single or multiple operators).

For a single service provider (SP), an LTE/LTE-A network with unlicensed spectrum may be configured to be synchronous with a LTE network on the licensed spectrum. However, LTE/LTE-A networks with unlicensed spectrum deployed on a given channel by multiple SPs may be configured to be synchronous across the multiple SPs. One approach to incorporate both the above features may involve using a constant timing offset between LTE/LTE-A networks without unlicensed spectrum and LTE/LTE-A networks with unlicensed spectrum for a given SP. An LTE/LTE-A network with unlicensed spectrum may provide unicast and/or multicast services according to the needs of the SP. Moreover, an LTE/LTE-A network with unlicensed spectrum may operate in a bootstrapped mode in which LTE cells act as anchor and provide relevant cell information (e.g., radio frame timing, common channel configuration, system frame number or SFN, etc.) for LTE/LTE-A cells with unlicensed spectrum. In this mode, there may be close interworking between LTE/LTE-A without unlicensed spectrum and LTE/LTE-A with unlicensed spectrum. For example, the bootstrapped mode may support the supplemental downlink and the carrier aggregation modes described above. The PHY-MAC layers of the LTE/LTE-A network with unlicensed spectrum may operate in a standalone mode in which the LTE/LTE-A network with unlicensed spectrum operates independently from an LTE network without unlicensed spectrum. In this case, there may be a loose interworking between LTE without unlicensed spectrum and LTE/LTE-A with unlicensed spectrum based on RLC-level aggregation with co-located LTE/LTE-A with/without unlicensed spectrum cells, or multiflow across multiple cells and/or base stations, for example.

The techniques described herein are not limited to LTE, and may also be used for various wireless communications systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). LTE and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description below, however, describes an LTE system for purposes of example, and LTE terminology is used in much of the description below, although the techniques are applicable beyond LTE applications.

Thus, the following description provides examples, and is not limiting of the scope, applicability, or configuration set forth in the claims. Changes may be made in the function and arrangement of elements discussed without departing from the spirit and scope of the disclosure. Various aspects may omit, substitute, or add various procedures or components as appropriate. For instance, the methods described may be performed in an order different from that described, and various steps may be added, omitted, or combined. Also, features described with respect to certain aspects may be combined in other aspects.

Referring first to FIG. 1, a diagram illustrates an example of a wireless communications system or network 100. The system 100 includes base stations (or cells) 105, communication devices 115, and a core network 130. The base stations 105 may communicate with the communication devices 115 under the control of a base station controller (not shown), which may be part of the core network 130 or the base stations 105 in various aspects. Base stations 105 may communicate control information and/or user data with the core network 130 through backhaul links 132. In aspects, the base stations 105 may communicate, either directly or indirectly, with each other over backhaul links 134, which may be wired or wireless communication links. The system 100 may support operation on multiple carriers (waveform signals of different frequencies). Multi-carrier transmitters can transmit modulated signals simultaneously on the multiple carriers. For example, each communication link 125 may be a multi-carrier signal modulated according to the various radio technologies described above. Each modulated signal may be sent on a different carrier and may carry control information (e.g., reference signals, control channels, etc.), overhead information, data, etc.

The base stations 105 may wirelessly communicate with the devices 115 via one or more base station antennas. Each of the base station 105 sites may provide communication coverage for a respective geographic area 110. In some aspects, base stations 105 may be referred to as a base transceiver station, a radio base station, an access point, a radio transceiver, a basic service set (BSS), an extended service set (ESS), a NodeB, eNodeB (eNB), Home NodeB, a Home eNodeB, or some other suitable terminology. The coverage area 110 for a base station may be divided into sectors making up only a portion of the coverage area (not shown). The system 100 may include base stations 105 of different types (e.g., macro, micro, and/or pico base stations). There may be overlapping coverage areas for different technologies.

In some aspects, the system 100 is an LTE/LTE-A network that supports one or more unlicensed spectrum modes of operation or deployment scenarios. In other aspects, the system 100 may support wireless communications using an unlicensed spectrum and an access technology different from LTE/LTE-A with unlicensed spectrum, or a licensed spectrum and an access technology different from LTE/LTE-A. The terms evolved Node B (eNB) and user equipment (UE) may be generally used to describe the base stations 105 and devices 115, respectively. The system 100 may be a Heterogeneous LTE/LTE-A network with or without unlicensed spectrum in which different types of eNBs provide coverage for various geographical regions. For example, each eNB 105 may provide communication coverage for a macro cell, a pico cell, a femto cell, and/or other types of cell. Small cells such as pico cells, femto cells, and/or other types of cells may include low power nodes or LPNs. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNB for a macro cell may be referred to as a macro eNB. An eNB for a pico cell may be referred to as a pico eNB. And, an eNB for a femto cell may be referred to as a femto eNB or a home eNB. An eNB may support one or multiple (e.g., two, three, four, and the like) cells.

The core network 130 may communicate with the eNBs 105 via a backhaul 132 (e.g., Si, etc.). The eNBs 105 may also communicate with one another, e.g., directly or indirectly via backhaul links 134 (e.g., X2, etc.) and/or via backhaul links 132 (e.g., through core network 130). The system 100 may support synchronous or asynchronous operation. For synchronous operation, the eNBs may have similar frame and/or gating timing, and transmissions from different eNBs may be approximately aligned in time. For asynchronous operation, the eNBs may have different frame and/or gating timing, and transmissions from different eNBs may not be aligned in time. The techniques described herein may be used for either synchronous or asynchronous operations.

The UEs 115 are dispersed throughout the system 100, and each UE may be stationary or mobile. A UE 115 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with macro eNBs, pico eNBs, femto eNBs, relays, and the like.

The communications links 125 shown in system 100 may include uplink (UL) transmissions from a mobile device 115 to a base station 105, and/or downlink (DL) transmissions, from a base station 105 to a mobile device 115. The downlink transmissions may also be called forward link transmissions while the uplink transmissions may also be called reverse link transmissions. The downlink transmissions may be made using a licensed spectrum (e.g., LTE), an unlicensed spectrum (e.g., LTE/LTE-A with unlicensed spectrum), or both (LTE/LTE-A with/without unlicensed spectrum). Similarly, the uplink transmissions may be made using a licensed spectrum (e.g., LTE), an unlicensed spectrum (e.g., LTE/LTE-A with unlicensed spectrum), or both (LTE/LTE-A with/without unlicensed spectrum).

In some aspects of the system 100, various deployment scenarios for LTE/LTE-A with unlicensed spectrum may be supported including a supplemental downlink (SDL) mode in which LTE downlink capacity in a licensed spectrum may be offloaded to an unlicensed spectrum, a carrier aggregation mode in which both LTE downlink and uplink capacity may be offloaded from a licensed spectrum to an unlicensed spectrum, and a standalone mode in which LTE downlink and uplink communications between a base station (e.g., eNB) and a UE may take place in an unlicensed spectrum. Base stations 105 as well as UEs 115 may support one or more of these or similar modes of operation. OFDMA communications signals may be used in the communications links 125 for LTE downlink transmissions in an unlicensed spectrum, while SC-FDMA communications signals may be used in the communications links 125 for LTE uplink transmissions in an unlicensed spectrum. Additional details regarding the implementation of LTE/LTE-A with unlicensed spectrum deployment scenarios or modes of operation in a system such as the system 100, as well as other features and functions related to the operation of LTE/LTE-A with unlicensed spectrum, are provided below.

Figure 2A:
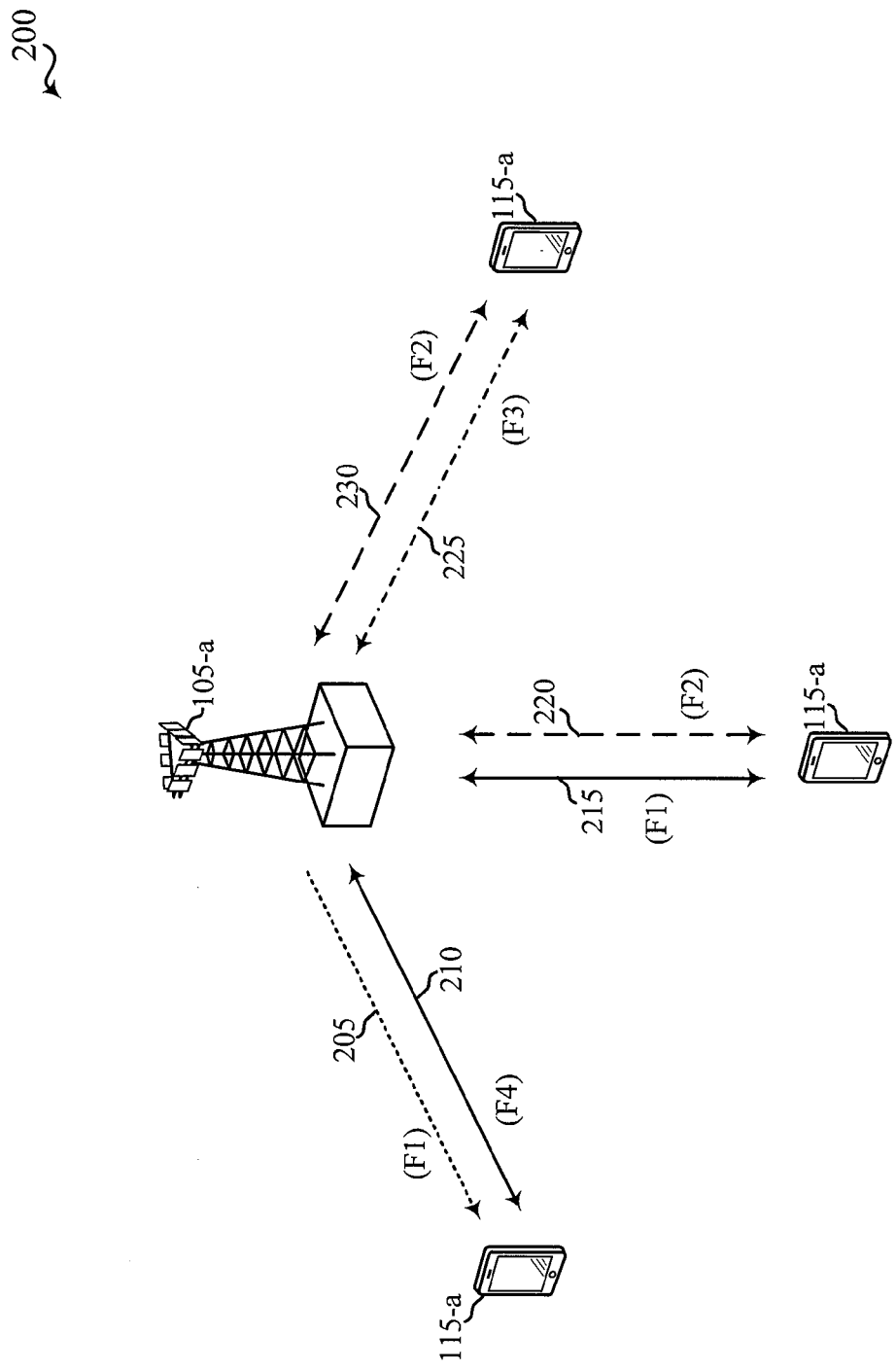
FIG. 2A shows a diagram that illustrates examples of deployment scenarios for using LTE in an unlicensed spectrum according to various aspects of the disclosure.

Turning next to FIG. 2A, a diagram 200 shows examples of a supplemental downlink mode and of a carrier aggregation mode for an LTE network that supports LTE/LTE-A with unlicensed spectrum. The diagram 200 may be an example of portions of the system 100 of FIG. 1. Moreover, the base station 105-a may be an example of the base stations 105 of FIG. 1, while the UEs 115-a may be examples of the UEs 115 of FIG. 1.

In the example of a supplemental downlink mode in diagram 200, the base station 105-a may transmit OFDMA communications signals to a UE 115-a using a downlink 205. The downlink 205 is associated with a frequency F1 in an unlicensed spectrum. The base station 105-a may transmit OFDMA communications signals to the same UE 115-a using a bidirectional link 210 and may receive SC-FDMA communications signals from that UE 115-a using the bidirectional link 210. The bidirectional link 210 is associated with a frequency F4 in a licensed spectrum. The downlink 205 in the unlicensed spectrum and the bidirectional link 210 in the licensed spectrum may operate concurrently. The downlink 205 may provide a downlink capacity offload for the base station 105-a. In some aspects, the downlink 205 may be used for unicast services (e.g., addressed to one UE) services or for multicast services (e.g., addressed to several UEs). This scenario may occur with any service provider (e.g., traditional mobile network operator or MNO) that uses a licensed spectrum and needs to relieve some of the traffic and/or signaling congestion.

In one example of a carrier aggregation mode in diagram 200, the base station 105-a may transmit OFDMA communications signals to a UE 115-a using a bidirectional link 215 and may receive SC-FDMA communications signals from the same UE 115-a using the bidirectional link 215. The bidirectional link 215 is associated with the frequency F1 in the unlicensed spectrum. The base station 105-a may also transmit OFDMA communications signals to the same UE 115-a using a bidirectional link 220 and may receive SC-FDMA communications signals from the same UE 115-a using the bidirectional link 220. The bidirectional link 220 is associated with a frequency F2 in a licensed spectrum. The bidirectional link 215 may provide a downlink and uplink capacity offload for the base station 105-a. Like the supplemental downlink described above, this scenario may occur with any service provider (e.g., MNO) that uses a licensed spectrum and needs to relieve some of the traffic and/or signaling congestion.

In another example of a carrier aggregation mode in diagram 200, the base station 105-a may transmit OFDMA communications signals to a UE 115-a using a bidirectional link 225 and may receive SC-FDMA communications signals from the same UE 115-a using the bidirectional link 225. The bidirectional link 225 is associated with the frequency F3 in an unlicensed spectrum. The base station 105-a may also transmit OFDMA communications signals to the same UE 115-a using a bidirectional link 230 and may receive SC-FDMA communications signals from the same UE 115-a using the bidirectional link 230. The bidirectional link 230 is associated with the frequency F2 in the licensed spectrum. The bidirectional link 225 may provide a downlink and uplink capacity offload for the base station 105-a. This example and those provided above are presented for illustrative purposes and there may be other similar modes of operation or deployment scenarios that combine LTE/LTE-A with or without unlicensed spectrum for capacity offload.

As described above, the typical service provider that may benefit from the capacity offload offered by using LTE/LTE-A with unlicensed spectrum is a traditional MNO with LTE spectrum. For these service providers, an operational configuration may include a bootstrapped mode (e.g., supplemental downlink, carrier aggregation) that uses the LTE primary component carrier (PCC) on the licensed spectrum and the LTE secondary component carrier (SCC) on the unlicensed spectrum.

In the supplemental downlink mode, control for LTE/LTE-A with unlicensed spectrum may be transported over the LTE uplink (e.g., uplink portion of the bidirectional link 210). One of the reasons to provide downlink capacity offload is because data demand is largely driven by downlink consumption. Moreover, in this mode, there may not be a regulatory impact since the UE is not transmitting in the unlicensed spectrum. There is no need to implement listen-before-talk (LBT) or carrier sense multiple access (CSMA) requirements on the UE. However, LBT may be implemented on the base station (e.g., eNB) by, for example, using a periodic (e.g., every 10 milliseconds) clear channel assessment (CCA) and/or a grab-and-relinquish mechanism aligned to a radio frame boundary.

In the carrier aggregation mode, data and control may be communicated in LTE (e.g., bidirectional links 210, 220, and 230) while data may be communicated in LTE/LTE-A with unlicensed spectrum (e.g., bidirectional links 215 and 225). The carrier aggregation mechanisms supported when using LTE/LTE-A with unlicensed spectrum may fall under a hybrid frequency division duplexing-time division duplexing (FDD-TDD) carrier aggregation or a TDD-TDD carrier aggregation with different symmetry across component carriers.

Figure 2B:
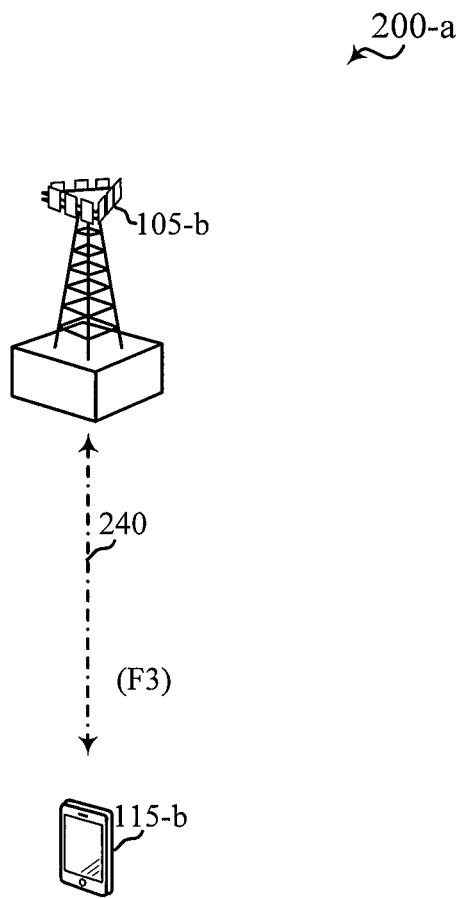
FIG. 2B shows a diagram that illustrates another example of a deployment scenario for using LTE in an unlicensed spectrum according to various aspects of the disclosure.

FIG. 2B shows a diagram 200-a that illustrates an example of a standalone mode for LTE/LTE-A with unlicensed spectrum. The diagram 200-a may be an example of portions of the system 100 of FIG. 1. Moreover, the base station 105-b may be an example of the base stations 105 of FIG. 1 and the base station 105-a of FIG. 2A, while the UE 115-b may be an example of the UEs 115 of FIG. 1 and the UEs 115-a of FIG. 2A.

In the example of a standalone mode in diagram 200-a, the base station 105-b may transmit OFDMA communications signals to the UE 115-b using a bidirectional link 240 and may receive SC-FDMA communications signals from the UE 115-b using the bidirectional link 240. The bidirectional link 240 is associated with the frequency F3 in an unlicensed spectrum described above with reference to FIG. 2A. The standalone mode may be used in non-traditional wireless access scenarios, such as in-stadium access (e.g., unicast, multicast). The typical service provider for this mode of operation may be a stadium owner, cable company, event hosts, hotels, enterprises, and large corporations that do not have licensed spectrum. For these service providers, an operational configuration for the standalone mode may use the PCC on the unlicensed spectrum. Moreover, LBT may be implemented on both the base station and the UE.

Figure 3:
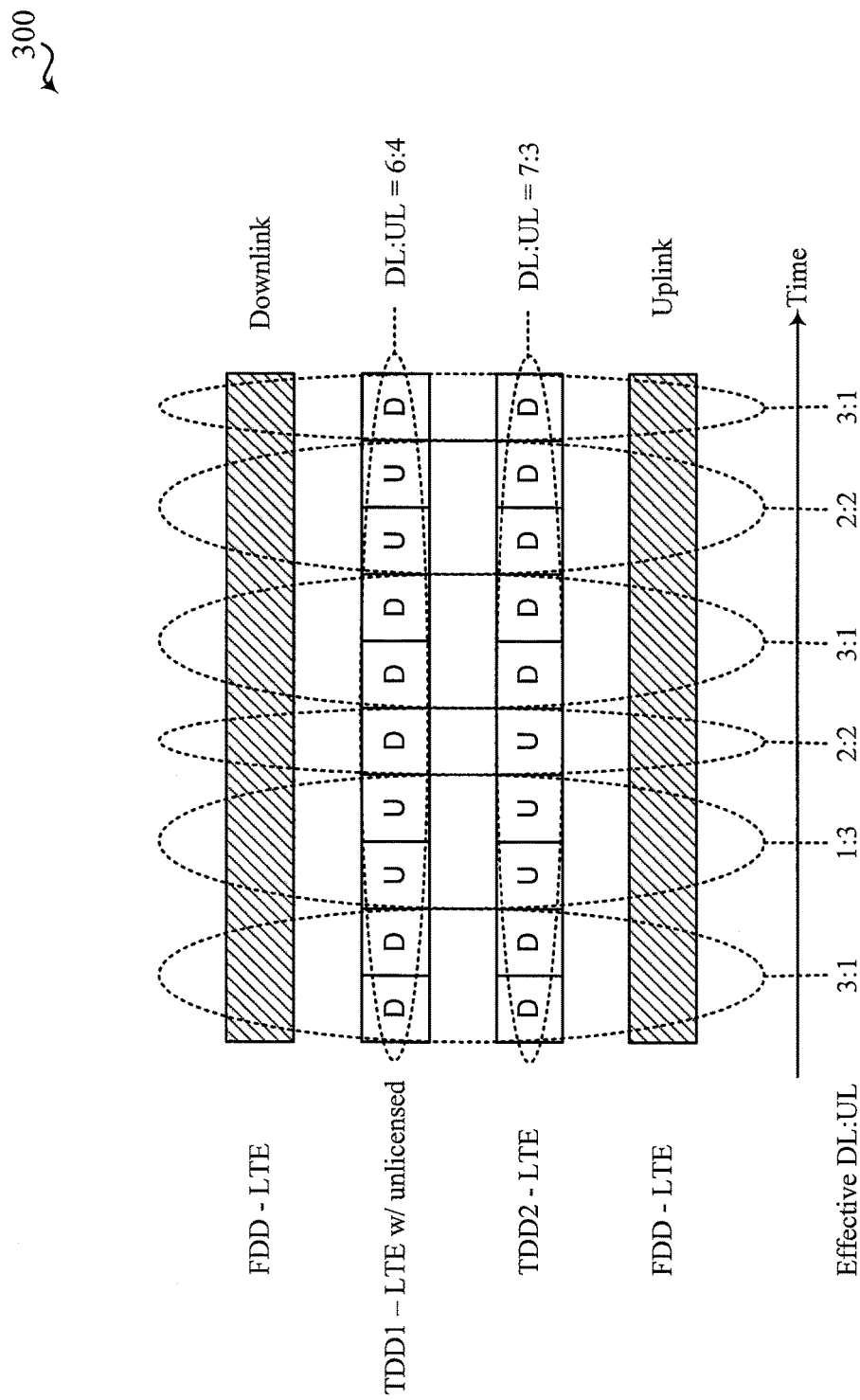
FIG. 3 shows a diagram that illustrates an example of carrier aggregation when using LTE concurrently in licensed and unlicensed spectrum according to various aspects of the disclosure.

Turning next to FIG. 3, a diagram 300 illustrates an example of carrier aggregation when using LTE concurrently in licensed and unlicensed spectrum according to various aspects. The carrier aggregation scheme in diagram 300 may correspond to the hybrid FDD-TDD carrier aggregation described above with reference to FIG. 2A. This type of carrier aggregation may be used in at least portions of the system 100 of FIG. 1. Moreover, this type of carrier aggregation may be used in the base stations 105 and 105-a of FIG. 1 and FIG. 2A, respectively, and/or in the UEs 115 and 115-a of FIG. 1 and FIG. 2A, respectively.

In this example, an FDD (FDD-LTE) may be performed in connection with LTE in the downlink, a first TDD (TDD1) may be performed in connection with LTE/LTE-A with unlicensed spectrum, a second TDD (TDD2) may be performed in connection with LTE with licensed spectrum, and another FDD (FDD-LTE) may be performed in connection with LTE in the uplink with licensed spectrum. TDD1 results in a DL:UL ratio of 6:4, while the ratio for TDD2 is 7:3. On the time scale, the different effective DL:UL ratios are 3:1, 1:3, 2:2, 3:1, 2:2, and 3:1. This example is presented for illustrative purposes and there may be other carrier aggregation schemes that combine the operations of LTE/LTE-A with or without unlicensed spectrum.

Figure 4:
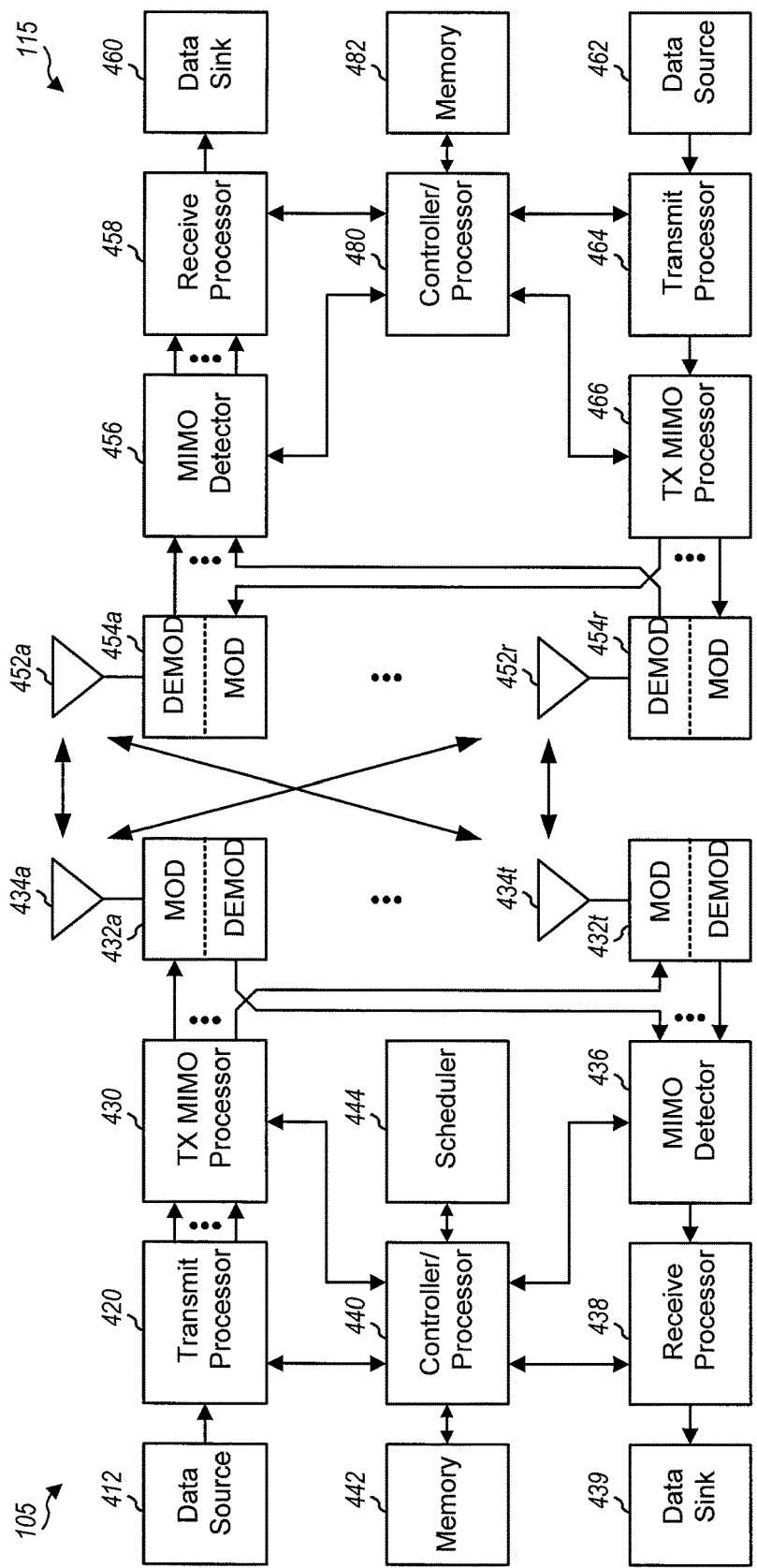
FIG. 4 is a block diagram conceptually illustrating a design of a base station/eNB and a UE configured according to one aspect of the present disclosure.

FIG. 4 shows a block diagram of a design of a base station/eNB 105 and a UE 115, which may be one of the base stations/eNBs and one of the UEs in FIG. 1. The eNB 105 may be equipped with antennas 434a through 434t, and the UE 115 may be equipped with antennas 452a through 452r. At the eNB 105, a transmit processor 420 may receive data from a data source 412 and control information from a controller/processor 440. The control information may be for the physical broadcast channel (PBCH), physical control format indicator channel (PCFICH), physical hybrid automatic repeat request indicator channel (PHICH), physical downlink control channel (PDCCH), etc. The data may be for the physical downlink shared channel (PDSCH), etc. The transmit processor 420 may process (e.g., encode and symbol map) the data and control information to obtain data symbols and control symbols, respectively. The transmit processor 420 may also generate reference symbols, e.g., for the primary synchronization signal (PSS), secondary synchronization signal (SSS), and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 115, the antennas 452a through 452r may receive the downlink signals from the eNB 105 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 115 to a data sink 460, and provide decoded control information to a controller/processor 480.

On the uplink, at the UE 115, a transmit processor 464 may receive and process data (e.g., for the physical uplink shared channel (PUSCH)) from a data source 462 and control information (e.g., for the physical uplink control channel (PUCCH)) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the eNB 105. At the eNB 105, the uplink signals from the UE 115 may be received by the antennas 434, processed by the modulators 432, detected by a MIMO detector 436 if applicable, and further processed by a receive processor 438 to obtain decoded data and control information sent by the UE 115. The processor 438 may provide the decoded data to a data sink 439 and the decoded control information to the controller/processor 440.

The controllers/processors 440 and 480 may direct the operation at the eNB 105 and the UE 115, respectively. The controller/processor 440 and/or other processors and modules at the eNB 105 may perform or direct the execution of various processes for the techniques described herein. The controllers/processor 480 and/or other processors and modules at the UE 115 may also perform or direct the execution of the functional blocks illustrated in FIGS. 9-14B, and/or other processes for the techniques described herein. The memories 442 and 482 may store data and program codes for the eNB 105 and the UE 115, respectively. A scheduler 444 may schedule UEs for data transmission on the downlink and/or uplink.

Figure 5:
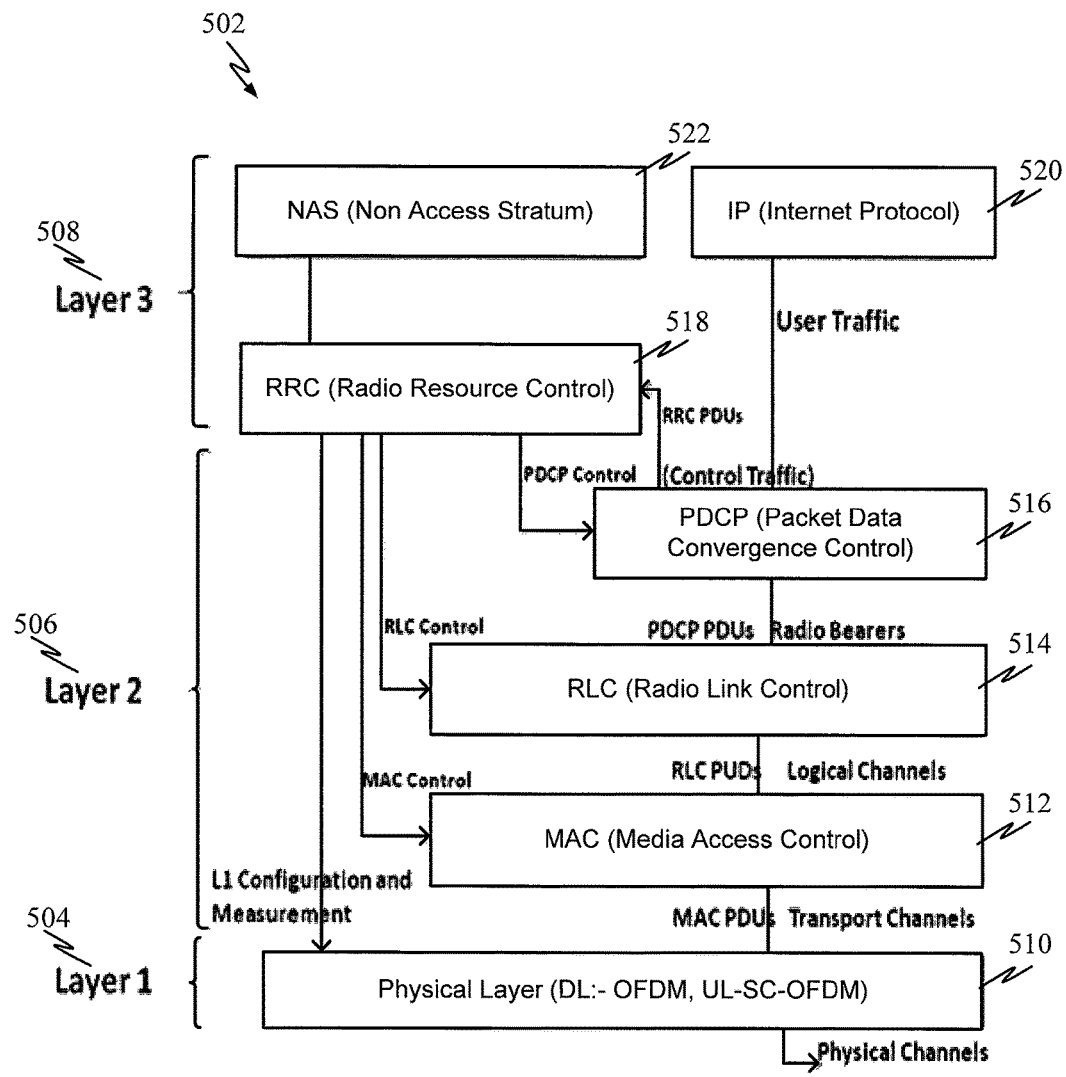
FIG. 5 shows a diagram that illustrates an example protocol stack that may be implemented for wireless transmissions over wireless networks according to various aspects of the disclosure.

FIG. 5 shows a diagram that illustrates an example protocol stack that may be implemented for wireless transmissions over wireless networks according to various aspects. In the aspect illustrated in FIG. 5, the protocol stack 502 includes at least three layers 504, 506, and 508. A first layer 504 may include PHY layer 510. A second layer 506 may include a MAC layer 512, a Radio Link Control (RLC) layer 514, and/or a Packet Data Convergence Control layer 516. A third layer 508 may include a Radio Resource Control (RRC) layer 518, an Internet Protocol (IP) layer 520, and/or a Non-Access Stratum (NAS) layer 522.

The PHY layer 510 may serve to carry information from transport channels of the MAC layer 512 over the air interface. The PHY layer 510 may also be used to perform link adaptation, power control, cell search, and other measurements for the RRC layer 518.

The MAC layer 512 may provide logical channels to the RLC layer 514 that it may multiplex into the PHY layer transport channels. The MAC layer 512 may also manage hybrid automatic repeat requests (HARQ) for error correction, prioritization of the logical channels for the same UE, and dynamic scheduling between UEs.

A base station may use HARQ for repeating a transmission over a downlink channel until the receiving UE can decode the transmission. In some aspects of the disclosure, HARQ may be a combination of high-rate forward error-correcting coding and ARQ (Auto Repeat Request) error-control. A receiver at a UE detecting a corrupted message may request a new message from the transmitting base station. In HARQ, the original data may be encoded with a forward error correction (FEC) code, and the parity bits may be either immediately sent along with the message or only transmitted upon request when a receiver detects an erroneous message.

Figure 6:
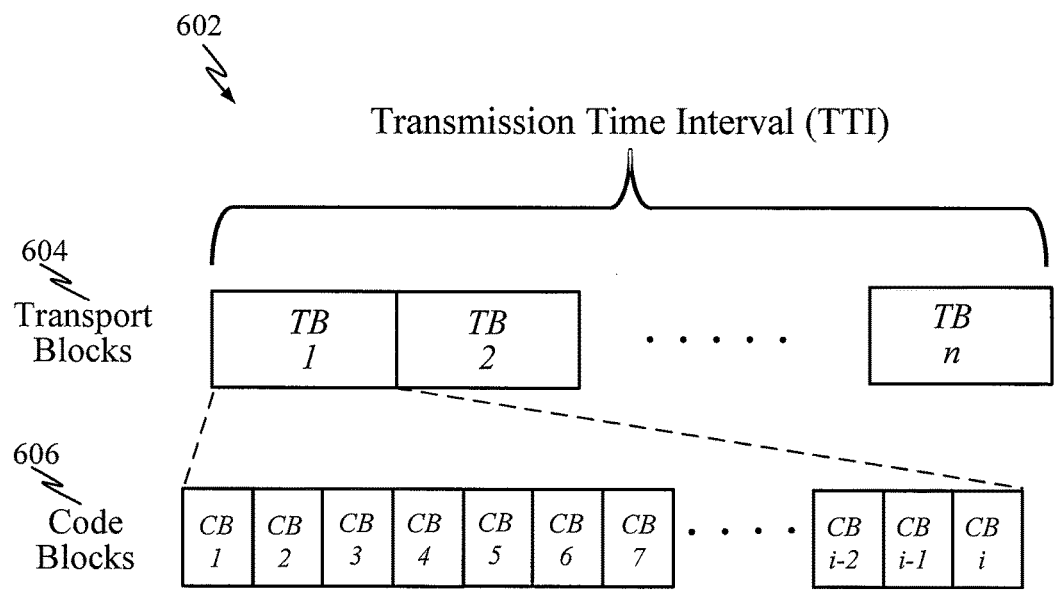
FIG. 6 shows a diagram that illustrates an example of blocks transmitted in a transmission time interval according to various aspects of the disclosure.

FIG. 6 shows a diagram that illustrates an example of blocks transmitted in a transmission time interval according to various aspects. A transmission 602 may be over an uplink channel or a downlink channel, such as a PDSCH. In the example illustrated in FIG. 6, multiple transport blocks 604 may be transmitted in a transmission time interval (TTI), such as 1 milli-seconds (ms). Each transport block 604 (also referred to herein as a transmission block) may include multiple code blocks 606. The number of code blocks 606 may vary based on the transport block size. Each transport block 604 may be associated with a cyclic redundancy check (CRC). In addition to a transport block-level CRC, each code block 606 of a transport block 604 may also be transmitted with its own CRC.

In some aspects, a HARQ process may be defined for each transport block 604 within a TTI. According to an aspect, in each HARQ process, a 24-bit CRC may be attached to each transport block 604. In some aspects, a transport block 604 CRC may be used for error detection and for generating a HARQ positive acknowledgement (ACK) or negative acknowledgement (NACK). In addition, in some aspects, a code block 606 CRC may be utilized at the receiver to enhance power saving and efficient memory utilization.

In one example, a transport block 604 may include up to sixteen (16) or more code blocks 606 within a TTI. At the receiver, if one of the code blocks 606 is in error, then a transport block 604 CRC failure may occur. As a result of the failure, a NACK may be signaled to a transmitter device for HARQ feedback. Upon receiving the NACK, the transmitter may retransmit the same transport block 604, and therefore the same set of code blocks 606, in an appropriate later TTI.

Figure 7:
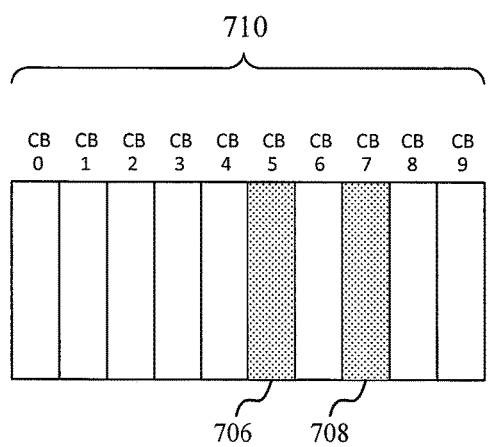
FIG. 7 shows a diagram that illustrates an example of a bursty interference signal in a transmission block according to one aspect of the present disclosure.

FIG. 7 shows a diagram that illustrates an example of a bursty interference signal in a transmission block according to one aspect of the present disclosure. In particular, FIG. 7 illustrates interference that may be perceived on a channel due to bursty puncturing transmissions. In the example illustrated in FIG. 7, code blocks $CB_0$-$CB_9$ may be interfered with by a first bursty puncturing transmission 706 and/or a second bursty puncturing transmission 708.

In some aspects, code blocks may be interleaved over frequency which helps enable quicker pipeline processing. However, there may be little time domain interleaving for each code block in a large transmission block size, resulting in one code block occupying a transmission symbol. Consequently, if a single code block is wiped out by the bursty puncturing 706 or 708, then the entire transmission block 710 may need to be resent. Thus, retransmission may occur at the transmission block level instead of the code block level, i.e., if one code block is punctured, the entire transmission block may be retransmitted.

Bursty interference traffic in a network may affect uplink channels and/or downlink channels. According to one aspect, a bursty interference signal, such as interference signal 706 or 708, may be a signal originating from a neighboring device in the network. In another aspect, the interfering signal may be one generated by the base station, such as a mission critical transmission sent from the base station to the mobile device. For example, a base station may utilize mission critical transmissions to inject mission critical messages in a downlink channel. Such bursty mission critical traffic may interfere with resources already assigned to other mobile devices for nominal data transmission. For instance, the mission critical message may be transmitted at a higher transmission power than other downlink/uplink transmissions.

Figure 8:
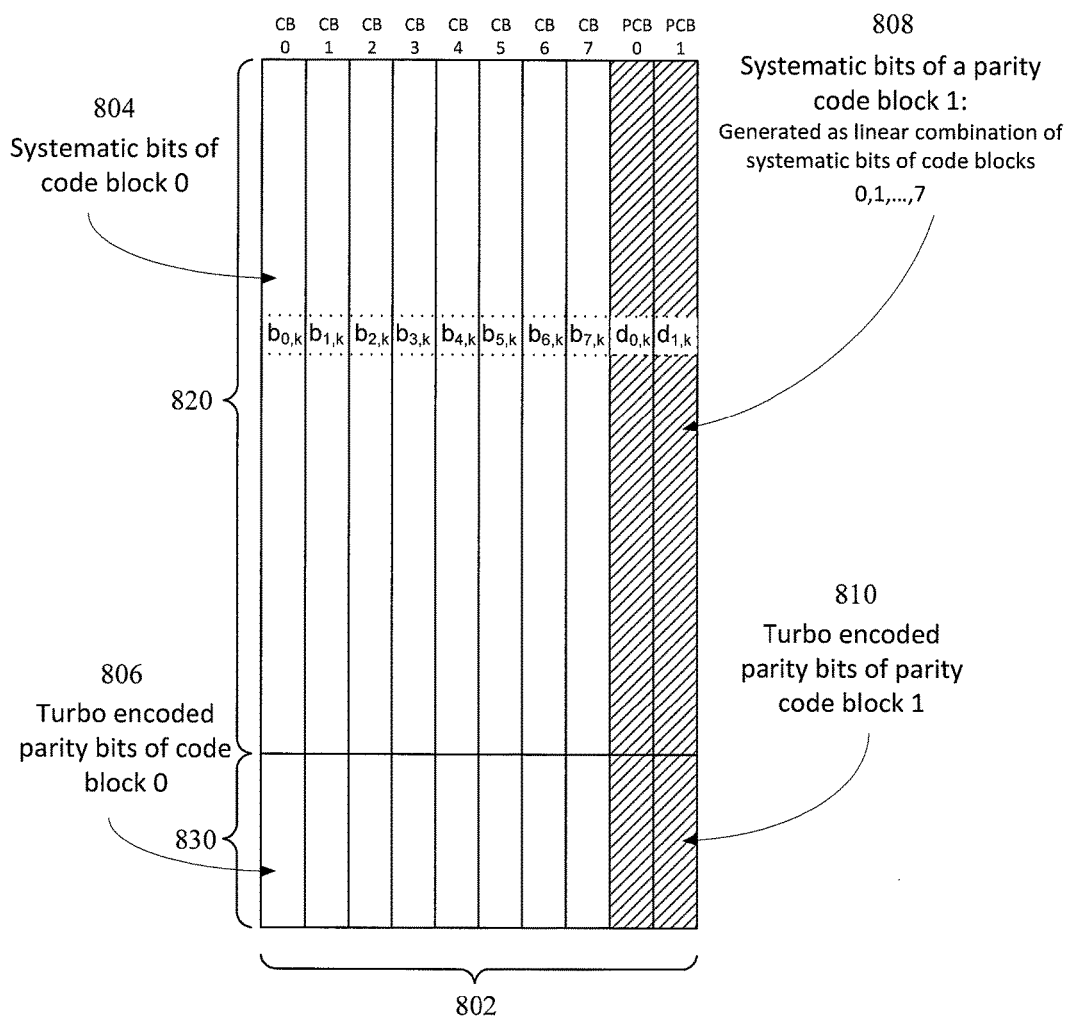
FIG. 8 shows a diagram that illustrates an example of a transmission block coded to mitigate bursty interference according to one aspect of the present disclosure.

FIG. 8 shows a diagram that illustrates an example of a transmission block coded to mitigate bursty interference according to one aspect of the present disclosure. A transmission block 802 may include one or more code blocks $CB_0$-$CB_7$ and one or more parity check code blocks $PCB_0$-$PCB_1$. Although transmission block 802 includes ten blocks consisting of eight code blocks $CB_0$-$CB_7$ and two parity check code blocks $PCB_0$-$PCB_1$, in general, a transmission block may include any number of blocks consisting of any combination of code blocks and parity check code blocks. According to the aspect of FIG. 8, a code block, for example code block $CB_0$, may include one or more information bits 820, such as information bits 804 of code block $CB_0$, and one or more parity bits 830, such as parity bits 806 of code block $CB_0$. Likewise, a parity check code block, for example parity check code block $PCB_1$, may include one or more information bits 820, such as information bits 808 of parity check code block $PCB_1$, and one or more parity bits 830, such as parity bits 810 of parity check code block $PCB_1$.

According to some aspect, parity bits for a code block or for a parity check code block may be encoded differently than the information bits for an associated code block or parity check code block. For example, in one aspect, parity bits may be turbo encoded. In other aspects, other forward error correction codes or more general error detecting codes may be used to encode the parity bits.

In some aspects, the information bits 820 of parity check code blocks, such as $PCB_0$ and/or $PCB_1$, may correspond to the information bits 820 of the one or more code blocks, such as $CB_0$-$CB_7$. In other words, information in a bit of a parity check code block, such as $PCB_0$ or $PCB_1$, may provide information about bits of the code blocks $CB_0$-$CB_7$. For example, as shown in the aspect of FIG. 8, bit $d_{0,k}$ or $d_{1,k}$ may provide information corresponding to bits $b_{0,k}$-$b_{7,k}$. Similarly, the parity bits 830 of parity check code blocks, such as $PCB_0$ and/or $PCB_1$, may correspond to the parity bits 830 of the one or more code blocks, such as $CB_0$-$CB_7$.

According to an aspect, each bit of a parity check code block may correspond to a different set of bits of the one or more code blocks. For example, whereas in the aspect of FIG. 8, bit $d_{0,k}$ from parity check code block $PCB_0$ corresponds to bits $b_{0,k}$-$b_{7,k}$ from code blocks $CB_{0,k}$-$CB_{7,k}$, bit $d_{0,k+2}$ from parity check code block $PCB_0$ may correspond to bits $b_{0,k+2}$-$b_{0,k+2}$ from code blocks $CB_{0,k}$-$CB_{7,k}$. In addition, although the aspect of FIG. 8 illustrates that a different set of bits of the one or more code blocks includes a single bit from each of the one or more code blocks, the present disclosure is not limited to such an aspect. For example, in another aspect, a set of bits to which a bit in a parity check code block may correspond may include more than one bit from a particular code block. In particular, in one aspect, bit $d_{0,k}$ from parity check code block $PCB_0$ may correspond to bits $b_{0,k}$ and $b_{0,k+1}$ from code block $CB_0$.

Figure 9:
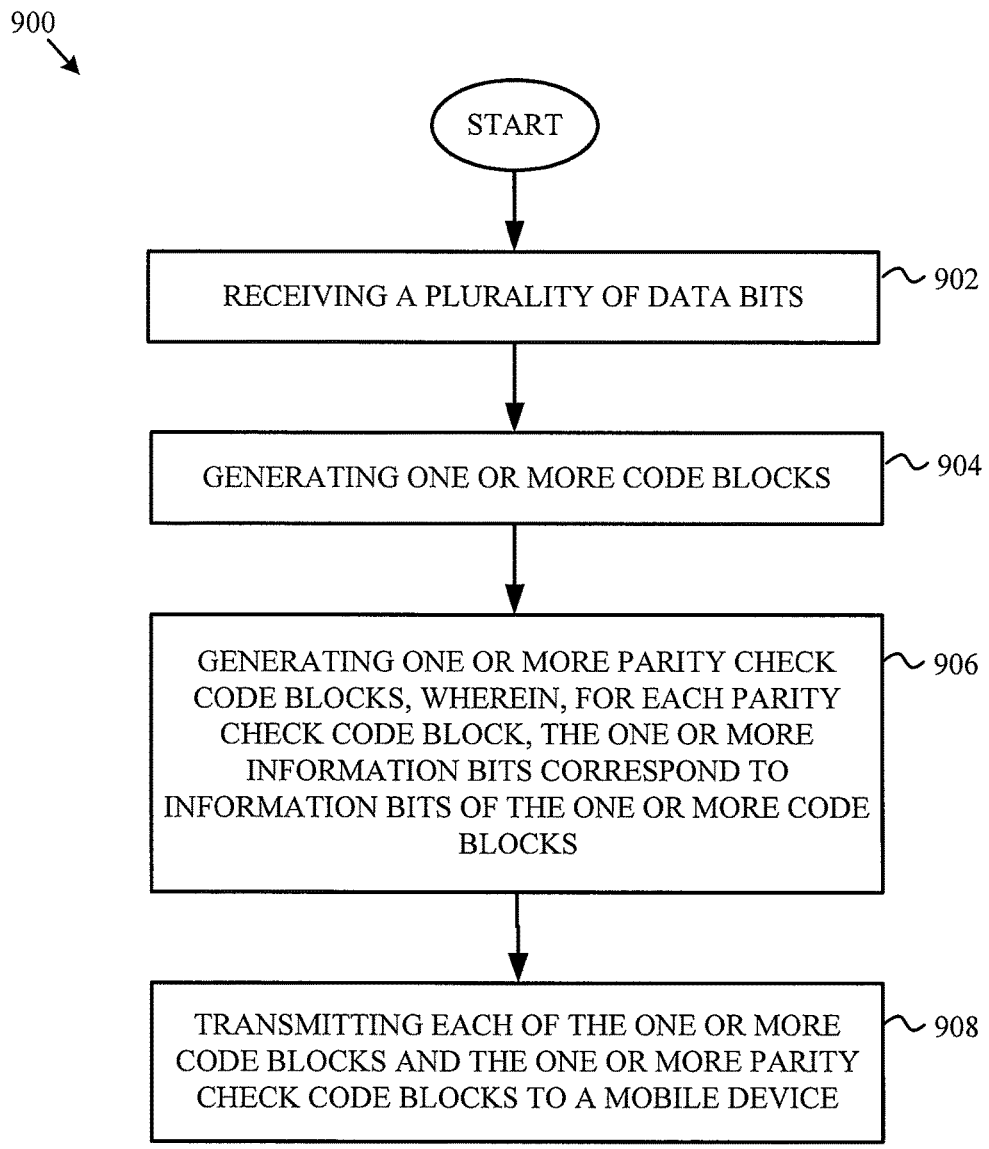
FIG. 9 is a schematic flow chart diagram illustrating a method for encoding data for wireless communication according to one aspect of the present disclosure.

FIG. 9 is a schematic flow chart diagram illustrating a method for encoding data for wireless communication according to one aspect of the present disclosure. Aspects of method 900 may be implemented with the aspects of this disclosure described with respect to FIGS. 1-8. Specifically, method 900 includes, at block 902, receiving a plurality of data bits. According to an aspect, the data bits may correspond to bits of any information to be transmitted over the wireless communication network.

At block 904, method 900 includes generating one or more code blocks. In some aspects, each of the one or more code blocks may include one or more information bits and one or more parity bits, such as is illustrated in FIG. 8 for code blocks $CB_0$-$CB_7$. The one or more information bits may be generated based, at least in part, on data bits in the received plurality of data bits. For example, in some aspects, each encoded information bit of a code block may have a one-to-one correspondence with a data bit of the received plurality of bits so that each encoded information bit of a code block corresponds to a different bit of the received plurality of data bits. In addition, the one or more parity bits may be generated based, at least in part, on the one or more information bits of the code block. For example, as mentioned with respect to the parity bits illustrated in FIG. 8, parity bits 830 of a code block, such as code block $CB_0$, may be encoded based on the information bits 820 in the code block, such as code block $CB_0$, using general error detecting codes or forward error correction codes, such as a turbo code.

At block 906, method 900 includes generating one or more parity check code blocks. In some aspects, each of the one or more parity check code blocks may include one or more information bits, such as is illustrated in FIG. 8 for parity check code blocks $PCB_0$-$PCB_1$. According to the aspect of FIG. 9, for each parity check code block, the one or more information bits may correspond to information bits of the one or more code blocks. For example, in some aspects, a base station may use a generator matrix to generate the one or more code blocks and/or the one or more parity check code blocks. In particular, according to one aspect, the generation of two parity check code block information bits based on the same set of eight information bits from eight code blocks may be defined as:

$$[d_{0,k} d_{1,k}] = [b_{0,k} b_{1,k} \ldots b_{7,k}] P_{8 \times 2} \quad (1)$$

According to some aspects, matrix P in equation (1) can be a full rank matrix with entries in GF(2), i.e., the entries are either 0 or 1. However, in general, matrix P can be derived from a generator matrix of any systematic linear block or convolutional code. As shown in equation (1), the matrix P can take as its input one or more information bits of code blocks and output the encoded information bits of one or more parity check code blocks.

In general, given an [n, k, d] linear block code, its generator matrix $G_{k \times n}$ can be written in systematic form, such as $G_{k \times n} = [I_{k \times k} | P_{k \times n-k}]$ (hereinafter referred to as $C_{row}$). With respect to erasure correction, in some aspects, a [n, k, d] linear block code can correct up to d−1 erasures. In addition, in some aspects, a Singleton bound for the linear block code can be defined as $d \leq n-k+1$. According to another aspect, an [n, k] maximum distance separable (MDS) code may meet the Singleton bound and may be able to correct n−k erasures.

According to aspects of the disclosure, each information bit of a parity check code block may be generated based, at least in part, on the set of information bits of the one or more code blocks to which the parity check code block information bit corresponds. For example, as shown in equation (1), in some aspects, each information bit of a parity check code block may correspond to a different set of information bits of the one or more code blocks. In addition, in some aspects, the different set of information bits of the one or more code blocks may include a single bit from each of the one or more code blocks. Therefore, in one aspect, with reference to FIG. 8, a parity check code block information bit $d_{0,k}$ of parity check code block $PCB_0$ generated using the matrix P defined in equation (1) for the transmission block 802 illustrated in FIG. 8 may be generated based on and correspond to information bits $b_{0,k}$-$b_{7,k}$ of codes blocks $CB_0$-$CB_7$.

In some aspects, in addition to generating the parity check code block information bits, a matrix P can also be used to generate encoded information bits of the one or more code blocks in a transmission block, such as, for example, the information bits 820 of codes blocks $CB_0$-$CB_7$ of transmission block 802 illustrated in FIG. 8. For example, in some aspects, matrix P can be in systematic form, in which the output bits of the matrix P include the information bits from the one or more code blocks that were input to the matrix P and a specified number of one or more information bits for one or more parity check code blocks.

In general, however, the matrix P need not be in systematic form. For example, the generator matrix can be a full matrix, which can be converted into systematic form for different aspects. One advantage of using a full rank matrix is that a full rank matrix ensures that the parity check code block are linearly independent. In some aspects, when the generator matrix is not in systematic form, the output bits of the matrix P may not include the identical bits that were input to the matrix P. For example, in one aspect, data bits from the received data bits, such as the plurality of data bits received at block 902, may be input to the matrix P, and the output bits may include code block information bits that correspond to the input data bits as well a specified number of one or more information bits for one or more parity check code blocks. Therefore, in some aspects, each information bit of a parity check code block may be generated based, at least in part, on the same data bits in the received plurality of data bits used to generate the set of information bits of the one or more code blocks to which the parity check code block bit corresponds.

Each information bit of a parity check code block may also be generated based, at least in part, on code blocks not part of the transmission block in addition to being generated based, at least in part, on code blocks part of the transmission block. For example, in some aspects of the disclosure, parity check code blocks may be generated based on the code blocks contained in two or more transmission blocks. This may reduce the overhead associated with the addition of parity check code blocks to transmission blocks. For example, in such aspects, not all transmission blocks may need parity check code blocks because redundancy for the code blocks to perform error correction may have been incorporated, i.e., coded, into parity check code blocks of another transmission block.

In some aspects, each of the one or more parity check code blocks may also include one or more parity bits, such as is illustrated in FIG. 8 for code blocks $PCB_0$-$PCB_1$. Similar to the parity bits of code blocks, for each parity check code block, the one or more parity bits may be generated based, at least in part, on the one or more information bits of the parity check code block. For example, as mentioned with respect to the parity bits illustrated in FIG. 8, parity bits of a parity check code block may be encoded based on the information bits in the code block using general error detecting codes or forward error correction codes, such as a turbo code.

According to an aspect of the disclosure, the base station may determine the number of parity check code blocks to generate, such as at block 906, based on information received from a mobile device. For example, the information received from the mobile device may include a recommended number of parity check code blocks to generate. In some aspects, the mobile device may determine the recommended number based, at least in part, on decoding statistics associated with a decoder at the mobile device. For example, in one aspect, the statistics may be long term statistics indicating the fraction of code blocks in a transmission block that decode successfully without using parity check code blocks.

When a base station receives from a mobile device a recommended number of parity check code blocks to generate, the base station may or may not generate the recommended number of parity check code blocks. For example, in some aspects, the base station may generate the recommended number of parity check code blocks. In other aspects, the base station may determine that generating the recommended number of parity check code blocks would impose significant overhead constraints, and therefore not generate the recommended number of parity check code blocks. In yet another aspect, the base station may add or subtract a number of parity check code blocks to generate to the received recommended number of parity check code blocks to generate, and then generate that many parity check code blocks. In general, there are numerous constraints based on which a base station may or may not generate the recommended number parity check code blocks, and one of skill in the art would readily recognize that the determination by the base station is not limited to the specific scenarios disclosed herein.

A base station may also detect or identify interference signals in a network and modify wireless communication accordingly, such as by informing a mobile device of the identified interference signal or modifying the number of parity check code blocks included in a transmission block. In particular, a base station may be configured to identify an interference signal. For example, a base station may identify that a neighboring mobile device has or will transmit an ACK/NACK signal that is likely to interfere with communications being sent to another mobile device. In another example, the base station may identify an interference signal based on a determination that it has or will transmit a mission critical message to a mobile device that is likely to interfere with communications being sent to the mobile device or another mobile device.

When a base station has identified an interference signal, the base station may modify communications accordingly. For example, in one aspect of the disclosure, the base station may transmit a notification to the mobile device, such as, for example, via a side channel, which indicates that an interference signal has been identified as well as which of the one or more code blocks will be affected by the interference signal. Accordingly, a mobile device may receive a notification from a base station, such as, for example, via a side channel which indicates that an interference signal has been identified as well as which of the one or more code blocks will be affected by the interference signal. The mobile device may subsequently decode the received one or more code blocks of a transmission block based, at least in part, on the received notification, such as by employing one of the decoding schemes disclosed herein.

The base station may also dynamically adapt the number of parity check code blocks to generate based, at least in part, on the identified interference signal. For example, when a base station has identified that it will send a mission critical message likely to cause bursty interference, the base station may dynamically adapt the coding of a transmission block to include more parity check code blocks to improve the decodability of transmitted transmission blocks.

Returning to FIG. 9, at block 908, method 900 includes transmitting each of the one or more code blocks and the one or more parity check code blocks to a mobile device. For example, after the base station has generated the code blocks and the parity check code blocks using a generator matrix, the base station may transmit the code blocks and parity check code blocks to a mobile device.

Block codes may be decoded in a number of ways. For example, the codes may be decoded using hard parity checks or soft parity checks or both. As a brief example, and not limitation, in some aspects $C_{row}$ can represent a [n, k, d] binary linear block code capable of correcting e erasures. A mobile device may receive and decode code blocks $CB_0, \ldots, CB_k$. If all code blocks pass a cyclic redundancy check (CRC), the decoding may terminate. If e or less code blocks fail to pass a CRC, $C_{row}$ may be used to correct the e or less code blocks after turbo decoding. However, if more than e code blocks fail to pass a CRC, then, in some aspects, errors may not be correctable.

As one example of correcting erasures, in some aspects, a binary linear code block may be a [n, k] binary linear code capable of correcting n−k erasures. The generation of two parity check code block information bits may be defined as:

$$[d_{0,k} \quad d_{1,k}] = [b_{0,k} \cdot b_{1,k} \quad \ldots \quad b_{7,k}] \begin{bmatrix} 1 & 0 \\ 0 & 1 \\ 1 & 0 \\ 0 & 1 \\ 1 & 0 \\ 0 & 1 \\ 1 & 0 \\ 0 & 1 \end{bmatrix} \quad (2)$$

In equation (2), $d_{0,k}$ and $d_{1,k}$ may be information bits of two different parity check code blocks. In addition, as shown in equation (2), $d_{0,k}$ and $d_{1,k}$ may be generated based on information bits $b_{0,k}$-$b_{7,k}$ of code blocks $CB_{0,k}$-$CB_{7,k}$ and $C_{row}$. According to some aspects, when the information bits of parity check code blocks are defined as in equation (2) any pair of consecutive erasures $\{b_{j,k}, b_{j+1,k}\}$, $0 \leq j \leq 7$ can be corrected. As an example, $\{b_{0,k}, b_{1,k}\}$ may have been the only bits erased. From equation (2), $b_{0,k}$ and $b_{1,k}$ may be recovered as:

$b_{0,k} = d_{0,k} - b_{2,k} - b_{4,k} - b_{6,k}$ $b_{1,k} = d_{1,k} - b_{3,k} - b_{5,k} - b_{7,k}$

Therefore, as the foregoing has shown, when the information bits of parity check code blocks are defined as in equation (2), any pair of consecutive bits that are erased may be corrected as long as the remainder of the bits are known. In equation (2), $C_{row}$ was a code of length n=10. However, the example construction provided in equation (2) can be generalized to any n≥4.

As another example of correcting erasures, in some aspects, the generation of three parity check code block information bits may be defined as:

$$[d_{0,k} \quad d_{1,k} \quad d_{2,k}] = [b_{0,k} b_{1,k} \quad \ldots \quad b_{6,k}] \begin{bmatrix} 1 & 0 & 0 \\ 0 & 1 & 0 \\ 0 & 0 & 1 \\ 1 & 0 & 0 \\ 0 & 1 & 0 \\ 0 & 0 & 1 \\ 1 & 0 & 0 \end{bmatrix} \quad (3)$$

In equation (3), $d_{0,k}$, $d_{1,k}$, and $d_{2,k}$ may be information bits of three different parity check code blocks. In addition, as shown in equation (3), $d_{0,k}$, $d_{1,k}$, and $d_{2,k}$ may be generated based on information bits $b_{0,k}$-$b_{6,k}$ of code blocks $CB_{0,k}$-$CB_{6,k}$ and $C_{row}$. According to some aspects, when the information bits of parity check code blocks are defined as in equation (3) any triple of consecutive erasures $\{b_{j,k}, b_{j+1,k}, b_{j+2,k}\}$, $0 \leq j \leq 6$ can be corrected. In particular, the primary equations derived from equation (3) from which any triple of consecutive erasures are:

$$d_{0,k}=b_{0,k}+b_{3,k}+b_{6,k}$$

$$d_{1,k}=b_{1,k}+b_{4,k}$$

$$d_{2,k}=b_{2,k}+b_{5,k}$$

Therefore, as the foregoing has shown, when the information bits of parity check code blocks are defined as in equation (3), any triple of consecutive bits that are erased may be corrected as long as the remainder of the bits are known. In equation (3), $C_{row}$ was a code of length n=10. However, the example construction provided in equation (3) can be generalized to any n≥6.

In some aspects, the coding schemes disclosed herein may be applied independently to each codeword being transmitted by a base station in a PDSCH, while in other aspects the coding schemes may not. In addition, in some aspects, all the code blocks in a transmission block may be required to be of the same size, while in other aspects the code blocks may not be required to be of the same size.

Figure 10:
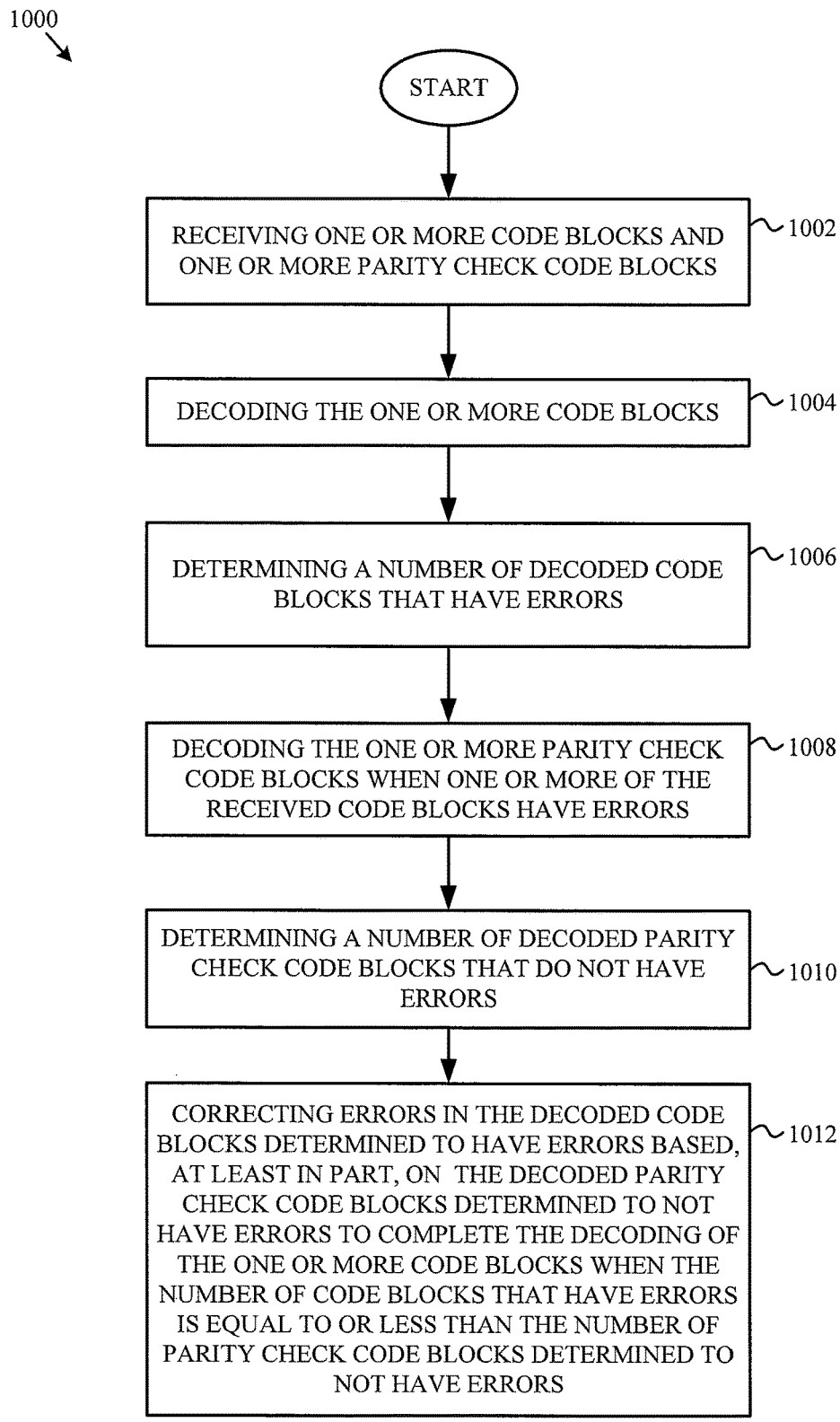
FIG. 10 is a schematic flow chart diagram illustrating a method for decoding data for wireless communication according to one aspect of the present disclosure.

FIG. 10 is a schematic flow chart diagram illustrating a method for decoding data for wireless communication using hard parity checks according to one aspect of the present disclosure. Aspects of method 1000 may be implemented with the aspects of this disclosure described with respect to FIGS. 1-8. Specifically, method 1000 includes, at block 1002, receiving one or more code blocks and one or more parity check code blocks. For example, in some aspects, a mobile device, such as communication devices 115, may receive the one or more code blocks and the one or more parity check code blocks.

At block 1004, method 1000 includes decoding the one or more code blocks. For example, a mobile device may decode the one or more received code blocks using a decoding scheme corresponding to the encoding scheme used to encode the one or more code blocks, such as a general error decoding scheme or forward error correction scheme, such as turbo decoding.

Method 1000 further includes, at block 1006, determining a number of decoded code blocks that have errors. In some aspects, a mobile device may perform a CRC for each decoded code block using the parity bits of the code block to determine if the code block has an error. The number of decoded code blocks that have errors may be subsequently determined by determining the number of decoded code blocks that did not pass the CRC.

At block 1008, method 1000 includes decoding the one or more parity check code blocks when one or more of the received code blocks are determined to have errors. Similar to the decoding of the code blocks, a mobile device may decode the one or more received parity check code blocks using a decoding scheme corresponding to the encoding scheme used to encode the one or more parity check code blocks, such as a general error decoding scheme or forward error correction scheme, such as turbo decoding Method 1000 includes, at block 1010, determining a number of decoded parity check code blocks that do not have errors. Similar to code blocks, in some aspects, a mobile device may perform a CRC for each decoded parity check code block using the parity bits of the parity check code block to determine if the parity check code block has an error. The number of decoded parity check code blocks that do not have errors may be subsequently determined by determining the number of decoded parity check code blocks that passed the CRC.

At block 1012, method 1000 includes correcting errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors. In some aspects, the number of parity check code blocks that need to be decoded to completely decode the one or more received code blocks may depend on the number of code blocks that did not pass the CRC. For example, in one aspect, when two code blocks are determined to have errors because the two code blocks did not pass a CRC, then a minimum of two parity check code blocks must be decoded with no errors to completely decode the one or more received code blocks using the parity check code blocks.

Because, prior to transmission of the transmission block, the parity check code block bits were generated based on the correct value of bits of the code blocks, the parity check code block bits may contain redundant and correct information about bits of the code blocks. Therefore, in some aspects, correcting the errors in the decoded code blocks determined to have errors may include using the equations used to generate the parity check code block bits, both information and parity, to determine the correct value of the bits in the decoded code blocks determined to have errors.

When none of the one or more decoded code blocks are determined to have errors, then decoding of the received code blocks may cease, and subsequent processing of the decoded code blocks may be performed. For example, if at block 1006, the mobile device determines that all the code blocks were decoded with no errors because all of the decoded code blocks passed CRC, then further decoding of the code blocks may cease after completion of the actions at block 1006. In addition, in some aspects, the mobile device may also forego decoding of the parity check code blocks, such as at block 1008, when none of the decoded code blocks was determined to have errors at block 1006.

According to some aspects, when the number of code blocks that have errors is greater than the number of parity check code blocks determined to not have errors, then correcting the errors in the decoded code blocks may not be possible. Therefore, when the number of code blocks that have errors is greater than the number of parity check code blocks determined to not have errors, a mobile device may transmit to a base station that originally transmitted the transmission block a request for retransmission of the transmission block. The base station may subsequently retransmit a transmission block upon receiving the retransmission request from the mobile device. In particular, a base station may receive a request from the mobile device for retransmission of the one or more code blocks and the one or more parity check code blocks when the number of code blocks that have errors is greater than the number of parity check code blocks that do not have errors, and, in response to receiving the request, may retransmit the transmission block that included the one or more code blocks and the one or more parity check code blocks to the mobile device.

Figure 11:
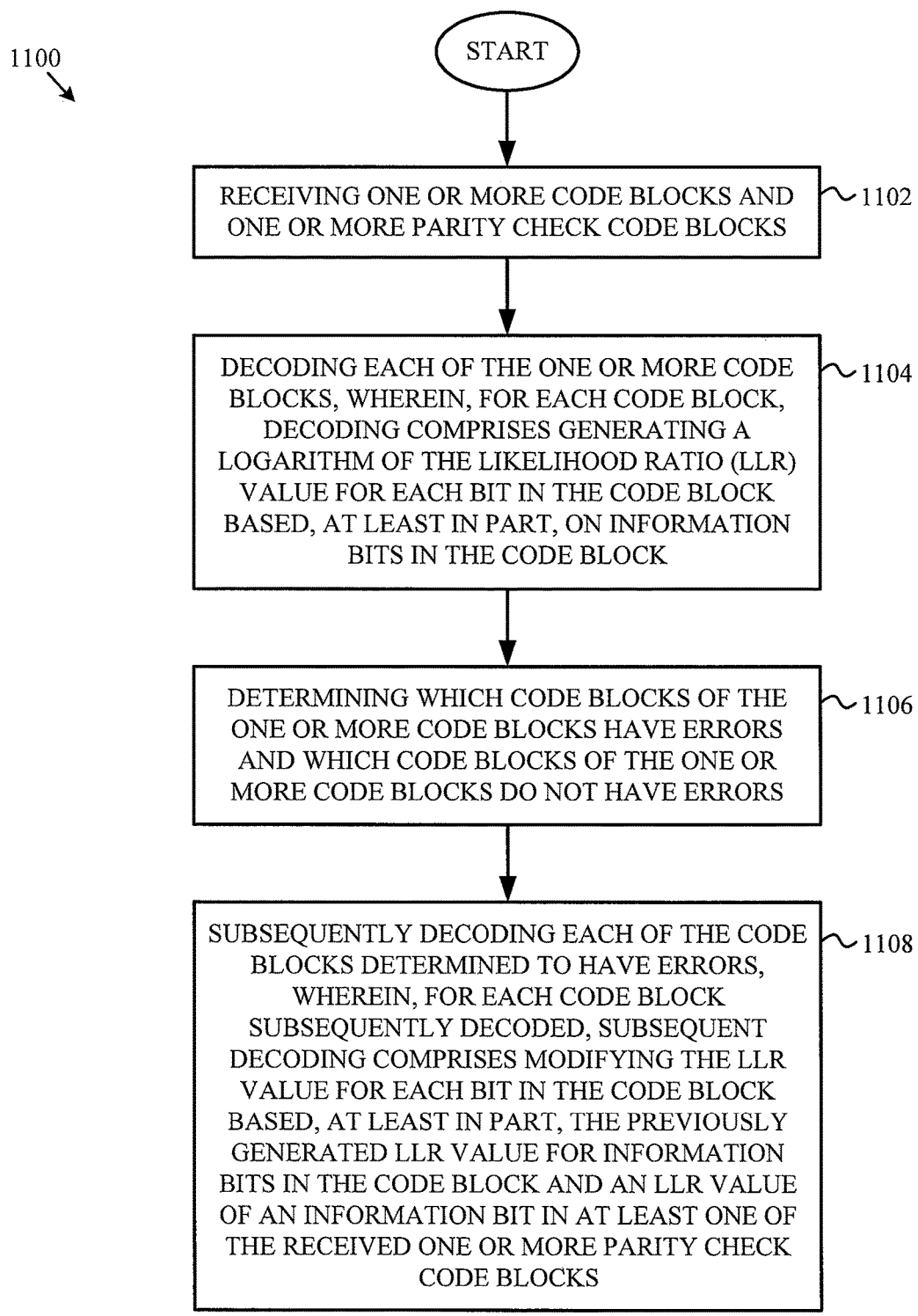
FIG. 11 is a schematic flow chart diagram illustrating another method for decoding data for wireless communication according to one aspect of the present disclosure.

FIG. 11 is a schematic flow chart diagram illustrating another method for decoding data for wireless communication according to one aspect of the present disclosure. Aspects of method 1100 may be implemented with the aspects of this disclosure described with respect to FIGS. 1-8. Specifically, method 1100 includes, at block 1102, receiving one or more code blocks and one or more parity check code blocks. For example, in some aspects, a mobile device, such as communication devices 115, may receive the one or more code blocks and the one or more parity check code blocks.

At block 1104, method 1100 includes decoding each of the one or more received code blocks, wherein, for each code block, decoding includes generating a logarithm of the likelihood ratio (LLR) value for each bit in the code block based, at least in part, on information bits in the code block. For example, in some aspects, a mobile device may employ a turbo decoder to perform a first turbo decoder iteration for each of the one or more received code blocks. In other aspects, other decoder codes may be used, such as general error detecting decoder codes or forward error correction decoder codes. According to an aspect, a first decoder iteration for a code block may be based solely on the information bits in the code block. The result of the first decoder iteration may be the generation of a LLR value for each bit in the code block.

Method 1100 includes, at block 1106, determining which code blocks of the one or more code blocks have errors and which code blocks of the one or more code blocks do not have errors. For example, in some aspects, for each decoded code block, a mobile device may perform a CRC using the parity bits of the code block to determine if the code block has errors or not.

At block 1108, method 1100 includes subsequently decoding each of the code blocks determined to have errors, wherein, for each code block subsequently decoded, subsequent decoding includes modifying the LLR value for each bit in the code block based, at least in part, on the previously generated LLR value for information bits in the code block and an LLR value of an information bit in at least one of the received one or more parity check code blocks. For example, in some aspects, a mobile device may employ a turbo decoder to perform subsequent turbo decoder iterations for each of the one or more received code blocks. In other aspects, other decoder codes may be used, such as general error detecting decoder codes or forward error correction decoder codes.

According to an aspect, subsequent decoder iterations for a code block may be based, at least in part, on the previously generated LLR value for information bits in the code block and an LLR value of an information bit in at least one of the received one or more parity check code blocks. For example, in an aspect in which a code block $CB_0$ contains 10 information bits $b_{0,k}$-$b_{0,k+9}$, the first turbo decoder iteration for code block $CB_0$ may be based solely on information bits $b_{0,k}$-$b_{0,k+9}$, and may generate an initial LLR value for each of information bits $b_{0,k}$-$b_{0,k+9}$. Likewise, for a parity check code block $PCB_0$ that also contains 10 information bits $d_{0,k}$-$d_{0,k+9}$, a first turbo decoder iteration for parity check code block $PCB_0$ may be based solely on information bits $d_{0,k}$-$d_{0,k+9}$, and may generate an initial LLR value for each of information bits $d_{0,k}$-$d_{0,k+9}$. However, a subsequent turbo decoder iteration for code block $CB_0$ may be based on the LLR values for information bits $b_{0,k}$-$b_{0,k+9}$ and the LLR values for information bits $d_{0,k}$-$d_{0,k+9}$. Because the information bits $d_{0,k}$-$d_{0,k+9}$ may be generated based on the information bits $b_{0,k}$-$b_{0,k+9}$, the information bits $d_{0,k}$-$d_{0,k+9}$ may provide extrinsic information related to information bits $b_{0,k}$-$b_{0,k+9}$ which can be used during subsequent turbo decoder iterations to improve the LLR values for information bits $b_{0,k}$-$b_{0,k+9}$. In other words, the result of a subsequent decoder iteration for a decoded code block may be the generation of an improved (more reliable) LLR value for each of the information bits in the code block.

According to some aspects, after each subsequent decoding of each of the code blocks determined to have errors, another determination may be made as to which code blocks still have errors. For example, after each subsequent turbo decoder iteration, another CRC may be performed for a subsequently-decoded code block to determine if the code block still has errors. The subsequent decoding may continue for subsequently-decoded code blocks determined to still have errors. In other words, in some aspects, subsequent decoding of code blocks may continue as long as the code blocks do not pass a CRC performed after each turbo decoder iteration. In other aspects, subsequent decoding of code blocks may cease when a pre-determined number of turbo decoder iterations have been performed.

In some aspect, when a decoded code block has been determined to have no errors, for example, when the decoded code block passes the CRC after the initial or a subsequent turbo decoder iteration, then the LLR values for the information bits in the decoded code block may be locked and no longer adjustable. In addition, in some aspects, when a decoded code block has been determined to have no errors, further decoding of the decoded code block may be terminated.

According to some aspects, the value to which the LLR value for a bit is locked may be different than the LLR value associated with the bit when the code block that includes the bit was determined to have no errors. As a specific example, and not limitation, in one aspect the decoder may output an LLR value of 3 for a bit, but when the LLR value for the bit is locked, the value to which the LLR value for the bit is locked may be 30. As another specific example, and not limitation, in another aspect the decoder may output an LLR value of −1.5 for a bit, but when the LLR value for the bit is locked, the value to which the LLR value for the bit is locked may be −30.

Aspects of this disclosure may yield significant improvements in processor computation and memory complexity. For example, because error recovery may be performed with addition over GF(2) and without the need for matrix inversion, computation complexity can be made minimal. In addition, because memory size may be independent of the number of code blocks in a transmission block, memory complexity can be reduced. In particular, memory may be dependent on the number of erasures that need to be corrected instead of the number of code blocks in a transmission block. For example, for each parity check code block information bit, only the binary sum of correctly-decoded code block information bits used to generate the parity check code block information bit may be needed to recover an erased bit that was also used to generate the parity check code block information bit. As a specific example, if $d_{0,k}=b_{0,k}+b_{2,k}+b_{4,k}+b_{6,k}$, and only $b_{6,k}$ is erased, then instead of keeping track of $b_{0,k}$, $b_{2,k}$, $b_{4,k}$ individually, only the sum $S_{even,k}=b_{0,k}+b_{2,k}+b_{4,k}$ needs to be tracked in memory because $b_{6,k}=d_{0,k}-b_{0,k}-b_{2,k}-b_{4,k}=d_{0,k}-S_{even,k}$. Hence, the memory associated with multiple bits can be reduced to a single bit.

Aspects of this disclosure may also be implemented with minimal overhead penalties. For example, in some aspects, k consecutive code block erasures may be corrected with k additional parity check code blocks. Assuming a transmission block has n code blocks, to correct the k consecutive code block erasures, the overhead factor may be defined as:

$$\text{Overhead} = \frac{k}{k+n} \qquad (4)$$

In some aspects, such as aspects wherein the correction of a fixed number of erasures k may be targeted, the overhead may be reduced as the number of code blocks n in the transmission block is increased.

Although the aspects disclosed herein may be implemented using current mapping protocols, aspects may also be implemented advantageously using alternative ways of mapping coded symbols to resource elements. For example, a time first mapping instead of a frequency first mapping may be advantageous because such a mapping may increase robustness to bursty interference in time. In addition, for a PUSCH with time first mapping, the coding scheme may protect against frequency selective interference.

Figure 12:
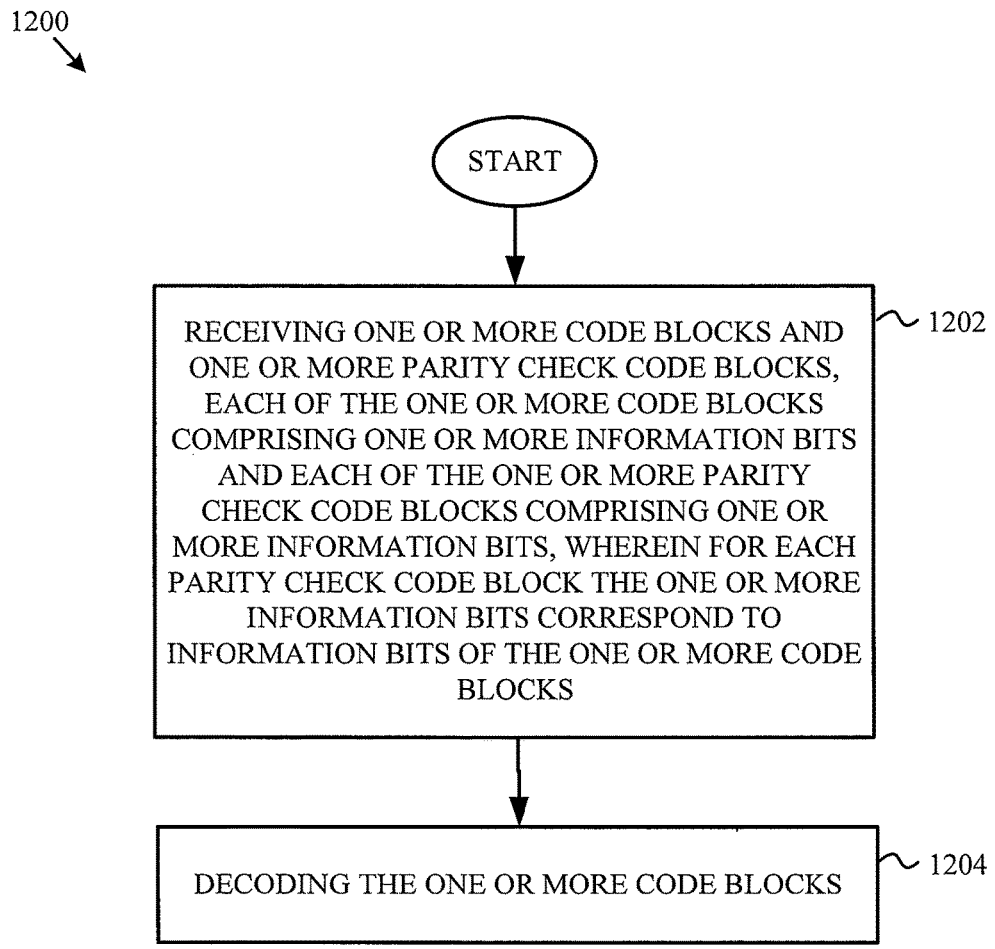
FIG. 12 is a schematic flow chart diagram illustrating yet another method for decoding data for wireless communication according to one aspect of the present disclosure.

FIG. 12 is a schematic flow chart diagram illustrating yet another method for decoding data for wireless communication according to one aspect of the present disclosure. Aspects of method 1200 may be implemented with the aspects of this disclosure described with respect to FIGS. 1-8. Specifically, method 1200 includes, at block 1202, receiving one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks. For example, in some aspects, a mobile device, such as communication devices 115, may receive the one or more code blocks and the one or more parity check code blocks. At block 1204, method 1200 includes decoding the received one or more code blocks. For example, decoding may include one of the decoding schemes disclosed with reference to FIGS. 10-11.

Aspects of this disclosure may include a multi-level processing scheme which includes both intra-code block (intra-CB) level HARQ and inter-code block (inter-CB) level error correction coding. The intra-CB level HARQ may serve primarily to mitigate against static interference/noise. The inter-CB error correction coding, such as the coding schemes described with reference to FIGS. 8-14B, may serve primarily to mitigate puncturing interference, such as interference caused by bursty traffic. In some aspects of the disclosure, the intra-CB level HARQ may be applicable to each code block. In other aspects of the disclosure, the inter-CB error correction coding may be applied across multiple code blocks to address bursty puncturing interference.

The intra-CB level HARQ may use PHY layer HARQ to repeat transmission when the receiving mobile device indicates that there was a transmission block error, such as by transmitting a NACK to the base station. The inter-CB error correction code may implement error correction coding, such as forward error correction coding as described with reference to FIGS. 8-14B, over the code blocks in one transmission block or over multiple transmission blocks.

According to some aspects of the disclosure, a base station may know when puncturing interference due to bursty traffic will occur. For example, a base station may know that it is going to send mission critical information which is likely to interfere with transmissions in the downlink and/or uplink channels. Knowing that bursty puncturing is imminent, the base station may use a side channel, such as an indicator/control/signaling channel, to inform a receiving mobile device that interference will occur at a particular code block or transport block. Puncturing interference may also be directly detected at the mobile device based on advanced receiver techniques. As an example, error correction of failed code blocks using inter-CB error correction may be adopted based on code block-level CRC outputs. In other words, CB-level CRC failure may indicate an erasure in a CB.

Upon receiving an indication that a particular code block was interfered with by an interference signal or upon identifying the interference, a mobile device may know that it needs to recover that punctured code block. In one aspect of the disclosure, the receiving mobile device may use the disclosed inter-CB error correction code to perform recovery of the affected individual code block(s). The inter-CB error correction code may cover information from a plurality of code blocks (in one or more transmission blocks) so as to be able to recover one or more of code blocks that may be corrupted, such as code blocks that were not decoded correctly.

As noted above, in one example of an inter-CB error correction code, redundancy of the information in the code blocks within a transmission block may be generated as an error correction code and sent as parity code blocks within a transmission block. The extent of the redundancy used by the error correction code (e.g., the number of parity code blocks used) may have a direct relationship to the expected bursty puncturing rate on the channel. For instance, if a transport block includes N code blocks, K code blocks out of N may be used for data packets while N-K code blocks may be used as parity code blocks or packets. Thus, the rate R=K/N may be selected to match the expected bursty puncturing rate. Accordingly, the throughput may be capped at the ratio of K/N of the peak throughput.

In one example, a receiving device may attempt to use the inter-CB error correction code to recover any code blocks that failed (e.g., could not be decoded). In some aspects of the disclosure, only if it is not able to recover the failed code blocks does the receiving device use the intra-CB level HARQ to notify the transmitting device that the whole transport block should be resent.

Figure 13A:
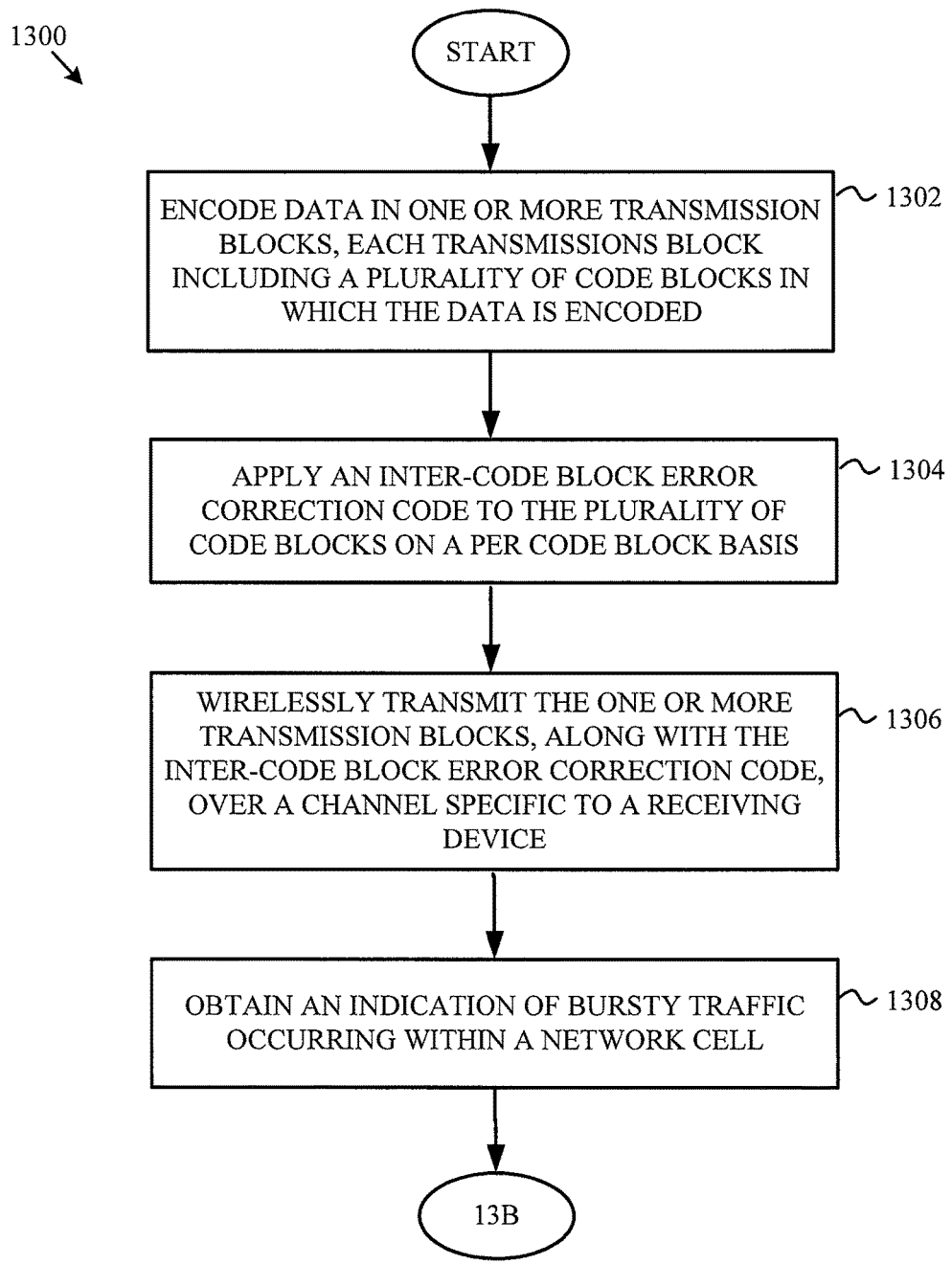
FIGS. 13A and 13B are schematic flow chart diagrams illustrating methods of wireless communication according to aspects of the present disclosure.
Figure 13B:
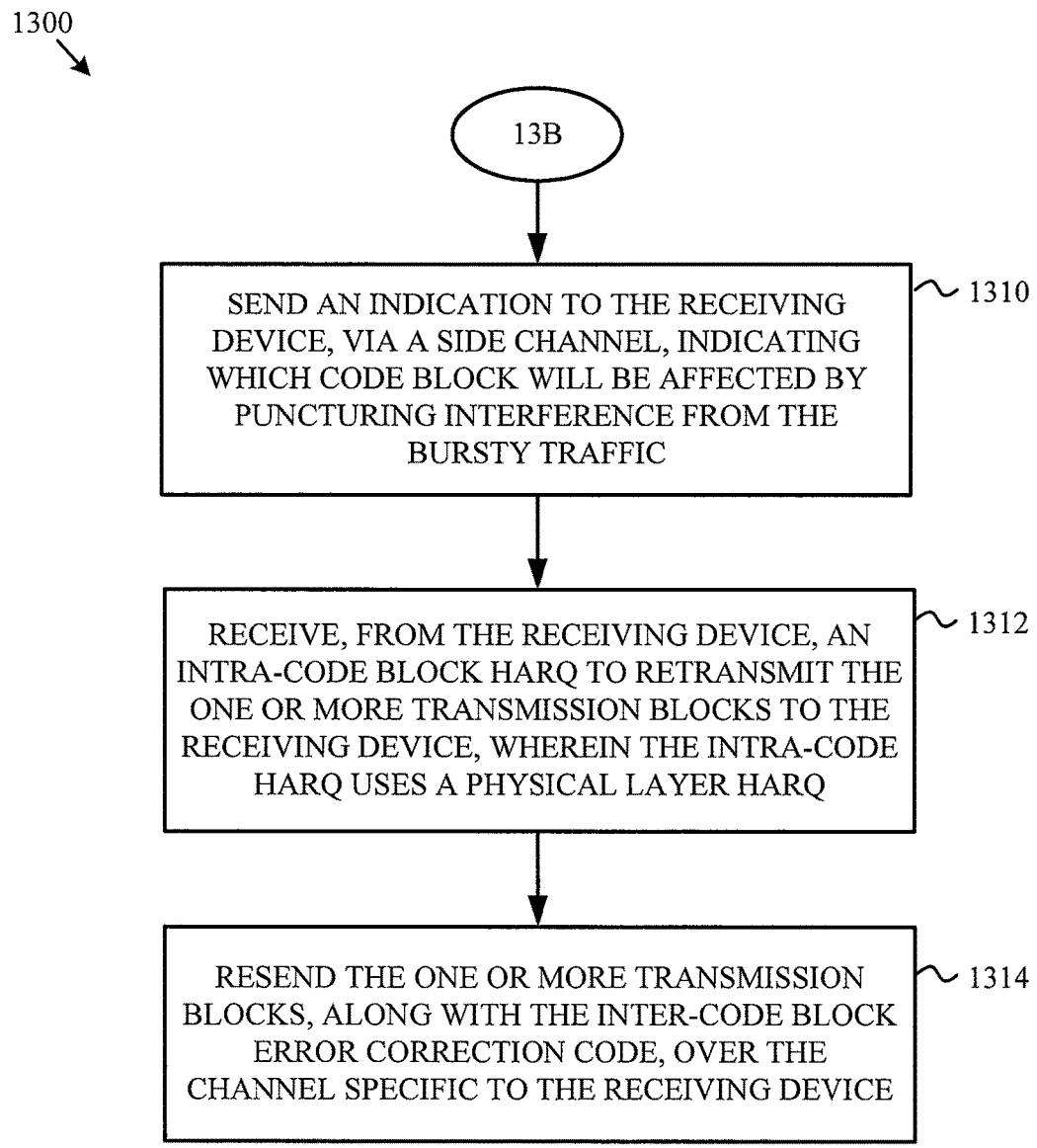

FIGS. 13A and 13B are schematic flow chart diagrams illustrating methods of wireless communication according to aspects of the present disclosure. Aspects of method 1300 may be implemented with the aspects of this disclosure described with respect to FIGS. 1-8. Specifically, method 1300 includes, at block 1302, encoding data in one or more transmission blocks, each transmission block including a plurality of code blocks in which the data is encoded. For example, the encoding may include the encoding illustrated in FIG. 8 and discussed with reference to FIGS. 9-12. At block 1304, method 1300 includes applying an inter-code block error correction code to the plurality of code blocks on a per code block basis. For example, the applied inter-code block error correction code may include the coding schemes described with reference to FIGS. 8-14B. The error correction code may cover a plurality of code blocks within a single transmission block or within a plurality of transmission blocks. At block 1306, method 1300 includes wirelessly transmitting the one or more transmission blocks, along with the inter-code block error correction code, over a channel specific to a receiving device.

At block 1308, method 1300 includes obtaining, by a base station, an indication of bursty traffic occurring within a network cell. Method 1300 includes, at block 1310, sending an indication to the receiving device, via a side channel, indicating which code block will be affected by puncturing interference from the bursty traffic. The inter-code block error correction code may be a forward error correction code that permits recovering one or more erroneous code blocks within the one or more transmission blocks. In various implementations, the network cell (area accessible by base station) may be distinct from another network cell in which the transmitting device operates or it may be the same network cell in which the transmitting device operates. At block 1312, method 1300 includes receiving, by the base station, from the receiving device, an intra-code block HARQ to retransmit the one or more transmission blocks to the receiving device, wherein the intra-code HARQ uses a physical layer HARQ. Consequently, at block 1314, method 1300 includes resending the one or more transmission blocks, along with the inter-code block error correction code, over the channel specific to the receiving device. According to an aspect of the disclosure, the inter-code block error correction code may cover either a plurality of code blocks within a single transmission block or a plurality of code blocks within a plurality of the one or more transmission blocks. In addition, in some aspects, the inter-code block error correction code may be dynamically adapted by the transmitting device based on expected interference over the channel.

Figure 14A:
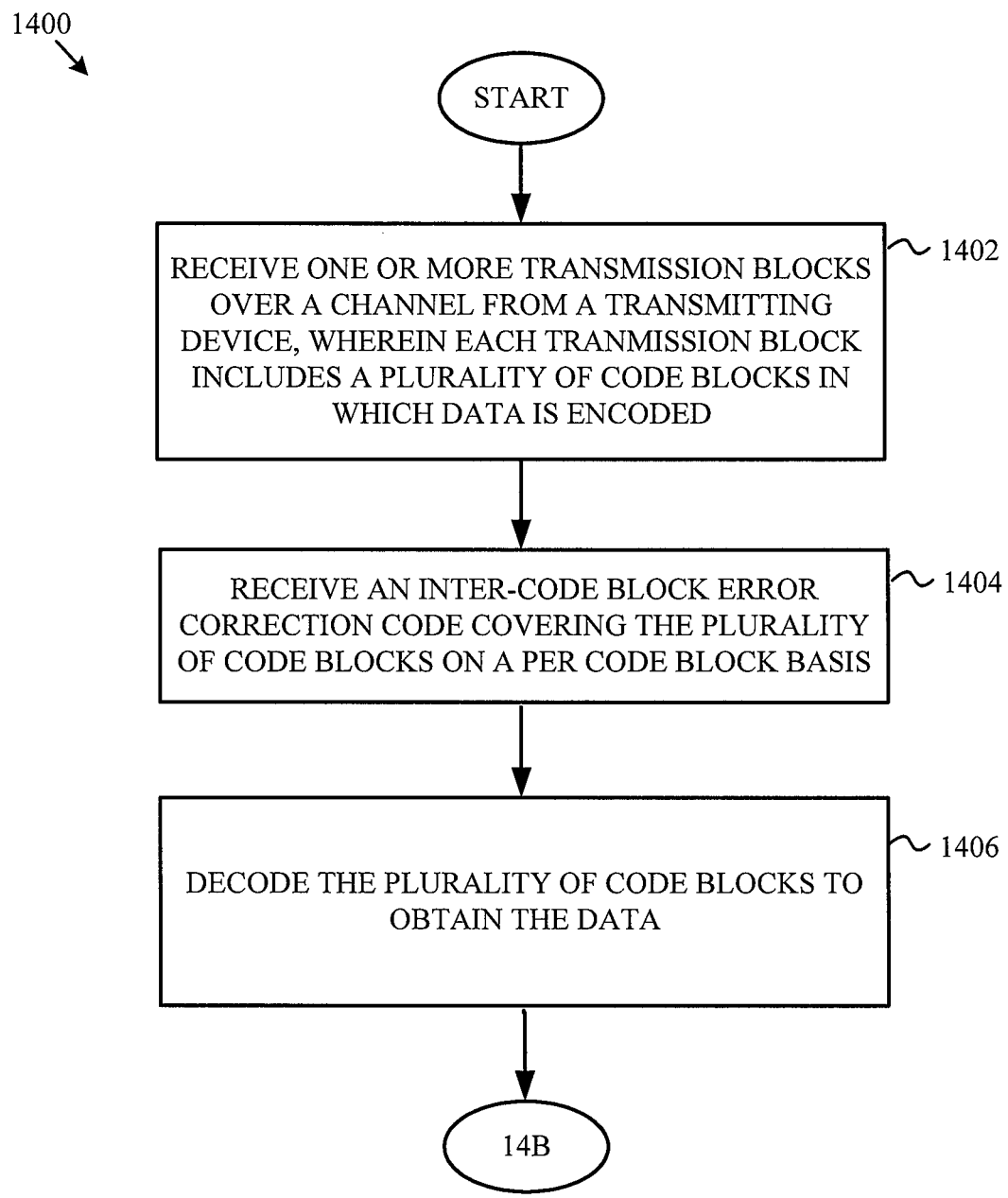
FIGS. 14A and 14B are schematic flow chart diagrams illustrating additional methods of wireless communication according to one aspects of the present disclosure.
Figure 14B:
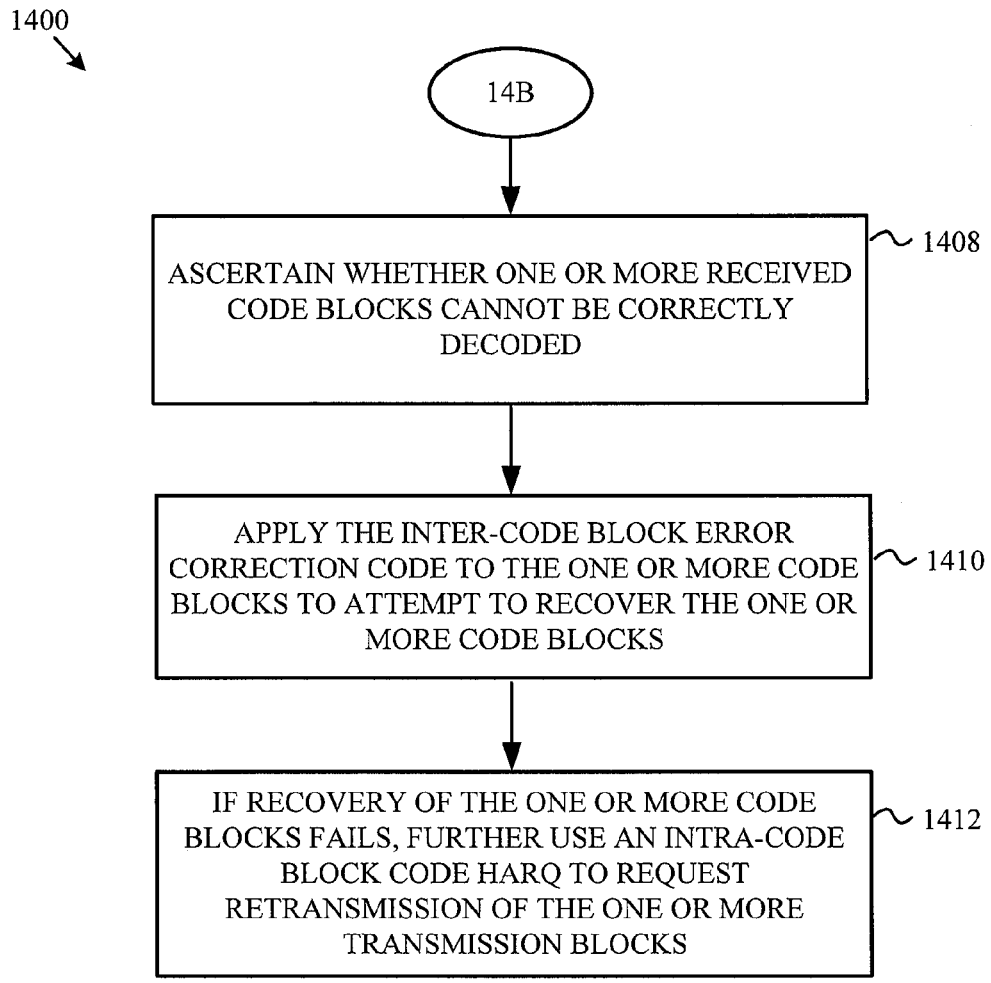

FIGS. 14A and 14B are schematic flow chart diagrams illustrating additional methods of wireless communication according to aspects of the present disclosure. Aspects of method 1400 may be implemented with the aspects of this disclosure described with respect to FIGS. 1-8. Specifically, method 1400 includes, at block 1402, receiving one or more transmission blocks over a channel from a transmitting device, such as a base station, wherein each transmission block includes a plurality of code blocks in which data is encoded. At block 1404, method 1400 may include receiving an inter-code block error correction code covering the plurality of code blocks on a per code block basis. Method 1400 includes, at block 1406, decoding the plurality of code blocks to obtain the data.

In one implementation, an indication may be received from the transmitting device, via a side channel, which indicates that one or more code blocks may be affected by puncturing interference from bursty traffic. Upon reception of the indication, the receiving device may apply the inter-code block error correction code to the plurality of code blocks to recover one or more code blocks. In various implementations, the inter-code block error correction code may cover a plurality of code blocks within a single transmission block or a plurality of code blocks within a plurality of transmission blocks. In some aspects, the inter-code block error correction code may be a forward error correction code that permits recovery of one or more erroneous code blocks within a transmission block.

At block 1408, method 1400 includes ascertaining, by the receiving device, whether one or more received code blocks cannot be correctly decoded. At block 1410, method 1400 includes applying the inter-code block error correction code to the one or more code blocks to attempt to recover the one or more code blocks. The inter-code block error correction code may be dynamically adapted by the transmitting device based on expected interference over the channel. At block 1412, method 1400 includes, if recovery of the one or more code blocks fails, using an intra-code block code HARQ to request retransmission of the one or more transmission blocks.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules in FIGS. 9-14B may include processors, electronics devices, hardware devices, electronics components, logical circuits, memories, software codes, firmware codes, etc., or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Computer-readable storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, a connection may be properly termed a computer-readable medium. For example, if the software is transmitted from a website, server, or other remote source using a coaxial cable, fiber optic cable, twisted pair, or digital subscriber line (DSL), then the coaxial cable, fiber optic cable, twisted pair, or DSL, are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C), or any combinations thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication, comprising:
   receiving, by a base station, a plurality of data bits;
   generating, by the base station, one or more code blocks, each of the one or more code blocks including one or more information bits and one or more parity bits, wherein for each code block the one or more information bits are generated based, at least in part, on data bits in the received plurality of data bits, and wherein for each code block the one or more parity bits are generated based, at least in part, on the one or more information bits of the code block;
   generating, by the base station, one or more parity check code blocks, each of the one or more parity check code blocks including one or more information bits, wherein for each parity check code block the one or more information bits correspond to information bits of the one or more code blocks, and wherein each information bit of a parity check code block corresponds to a different set of information bits of the one or more code blocks; and
   transmitting, by the base station, each of the one or more code blocks and the one or more parity check code blocks to a mobile device, wherein the one or more code blocks and the one or more parity check code blocks are decoded, by the mobile device, to determine a number of decoded code blocks that have errors and a number of decoded parity check code blocks that do not have errors, and wherein the errors in the decoded code blocks determined to have errors are corrected, by the mobile device, based, at least in part, on the decoded parity check code blocks determined to not have errors.

2. The method of claim 1, wherein each of the one or more parity check code blocks also includes one or more parity bits, and wherein for each parity check code block the one or more parity bits are generated based, at least in part, on the one or more information bits of the parity check code block.

3. The method of claim 1, further including determining, by the base station, a number of parity check code blocks to generate based on information received from the mobile device, wherein generating the one or more parity check code blocks includes generating the determined number of parity check code blocks.

4. The method of claim 3, wherein the information received from the mobile device includes a recommended number of parity check code blocks to generate, wherein the recommended number is determined based, at least in part, on decoding statistics associated with a decoder at the mobile device.

5. The method of claim 1, wherein the different set of information bits of the one or more code blocks includes a single bit from each of the one or more code blocks.

6. The method of claim 1, wherein each information bit of a parity check code block is generated based, at least in part, on the set of information bits of the one or more code blocks to which the parity check code block information bit corresponds.

7. The method of claim 1, wherein each information bit of a parity check code block is generated based, at least in part, on the same data bits in the received plurality of data bits used to generate the information bits of the one or more code blocks to which the parity check code block bit corresponds.

8. The method of claim 1, wherein each information bit of a parity check code block is generated based, at least in part, on the one or code blocks and additional code blocks not part of the one or more code blocks.

9. The method of claim 1, further including:
   identifying an interference signal; and
   transmitting a notification to the mobile device via a side channel which indicates which of the one or more code blocks will be affected by the interference signal.

10. The method of claim 1, further including:
    receiving a request from the mobile device for retransmission of the one or more code blocks and the one or more parity check code blocks when the number of code blocks that have errors is greater than the number of parity check code blocks that do not have errors; and
    retransmitting the one or more code blocks and the one or more parity check code blocks to the mobile device in response to receiving the retransmission request.

11. The method of claim 1, further including:
    identifying an interference signal; and
    dynamically adapting the number of parity check code blocks to generate based, at least in part, on the identified interference signal.

12. A method of wireless communication, comprising:
receiving, by a mobile device, one or more code blocks and one or more parity check code blocks, each of the one or more code blocks including one or more information bits and each of the one or more parity check code blocks including one or more information bits, and wherein each information bit of a parity check code block of the one or more parity check code blocks corresponds to a different set of information bits of the one or more code blocks;
decoding, by the mobile device, the one or more code blocks;
determining, by the mobile device, a number of decoded code blocks that have errors;
decoding, by the mobile device, the one or more parity check code blocks when one or more of the received code blocks have errors;
determining, by the mobile device, a number of decoded parity check code blocks that do not have errors; and
correcting, by the mobile device, errors in the decoded code blocks determined to have errors based, at least in part, on the decoded parity check code blocks determined to not have errors to complete the decoding of the one or more code blocks when the number of code blocks that have errors is equal to or less than the number of parity check code blocks determined to not have errors.

13. The method of claim 12, further including transmitting a request for retransmission to the base station when the number of code blocks that have errors is greater than the number of parity check code blocks determined to not have errors.

14. The method of claim 12, further including terminating decoding of the received one or more code blocks when none of the one or more code blocks have errors.

15. A method of wireless communication, comprising:
receiving, by a mobile device, one or more code blocks and one or more parity check code blocks, each of the one or more code blocks including one or more information bits and each of the one or more parity check code blocks including one or more information bits, and wherein each information bit of a parity check code block of the one or more parity check code blocks corresponds to a different set of information bits of the one or more code blocks;
decoding, by the mobile device, each of the one or more code blocks, wherein, for each code block, decoding includes generating a logarithm of a likelihood ratio (LLR) value for each bit in the code block based, at least in part, on the one or more information bits in the code block;
determining, by the mobile device, which code blocks of the one or more code blocks have errors and which code blocks of the one or more code blocks do not have errors;
decoding, by the mobile device, the one or more parity check code blocks, wherein, for each parity check code block, decoding includes generating an LLR value for each information bits in the parity check code block; and
correcting, by the mobile device, the code blocks determined to have errors based on the LLR value for information bits in the one or more code blocks and the LLR value for information bits in the one or more parity check code blocks, wherein the correcting includes subsequently decoding each of the code blocks determined to have errors, wherein, for each code block subsequently decoded, subsequent decoding includes modifying the LLR value for each bit in the code block based, at least in part, on the previously generated LLR value for information bits in the code block and the LLR value of an information bit in at least one of the received one or more parity check code blocks.

16. The method of claim 15, wherein, after each subsequent decoding of each of the code blocks determined to have errors, another determination of which code blocks of the subsequently decoded have errors is made, and wherein subsequent decoding continues for subsequently decoded code blocks determined to still have errors.

17. The method of claim 16, further including locking the LLR value for a bit when the code block that includes the bit has been determined to have no errors.

18. The method of claim 17, wherein the value to which the LLR value for a bit is locked is different than the LLR value for the bit when the code block that includes the bit was determined to have no errors.

19. The method of claim 16, further including terminating decoding of a code block when the code block is determined to have no errors.

20. A method of wireless communication, comprising:
receiving, by a mobile device, one or more code blocks and one or more parity check code blocks, each of the one or more code blocks including one or more information bits and each of the one or more parity check code blocks including one or more information bits, wherein for each parity check code block the one or more information bits correspond to information bits of the one or more code blocks, and wherein each information bit of a parity check code block of the one or more parity check code blocks corresponds to a different set of information bits of the one or more code blocks;
decoding, by the mobile device, the one or more code blocks; and
correcting, by the mobile device, code blocks, of the one or more code blocks, determined to have errors, based at least in part on the one or more parity check code blocks.

21. The method of claim 20, further including:
receiving a notification from a base station via a side channel which indicates which of the one or more code blocks will be affected by the interference signal; and
decoding the one or more code blocks based, at least in part, on the received notification.

22. The method of claim 20, wherein each of the one or more code blocks includes one or more parity bits and each of the one or more parity check code blocks includes one or more parity bits, wherein for each code block the one or more parity bits were generated based, at least in part, on the one or more information bits of the code block, and wherein for each parity check code block the one or more parity bits were generated based, at least in part, on the one or more information bits of the parity check code block.

23. The method of claim 20, further including terminating decoding of the received one or more code blocks when none of the one or more code blocks have errors.

24. The method of claim 20, further including transmitting to the base station a recommended number of parity check code blocks to generate, wherein the recommended number is determined based, at least in part, on statistics of the decoding performed by the mobile device.

* * * * *